US007465981B2

(12) United States Patent
Abe

(10) Patent No.: US 7,465,981 B2
(45) Date of Patent: Dec. 16, 2008

(54) SEMICONDUCTOR DEVICE AND A METHOD OF MANUFACTURING THE SAME

(75) Inventor: Kazuhide Abe, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 224 days.

(21) Appl. No.: 11/116,190

(22) Filed: Apr. 28, 2005

(65) Prior Publication Data

US 2006/0024906 A1    Feb. 2, 2006

(30) Foreign Application Priority Data

Jul. 30, 2004  (JP) ............................. 2004-224357

(51) Int. Cl.
 *H01L 27/108* (2006.01)
(52) U.S. Cl. ...................... 257/306; 438/396
(58) Field of Classification Search .......... 257/E21.021, 257/E21.295, E21.584, E21.649, E21.59, 257/E29.343, 306, 774, 758; 438/253, 396
See application file for complete search history.

(56) References Cited

U.S. PATENT DOCUMENTS 6,320,244 B1 * 11/2001 Alers et al. .................. 257/534
6,737,697 B2 * 5/2004 Kutsunai et al. ............ 257/306

FOREIGN PATENT DOCUMENTS

JP          10-256503         9/1998

* cited by examiner

*Primary Examiner*—David Vu
(74) *Attorney, Agent, or Firm*—Volentine & Whitt, P.L.L.C.

(57) ABSTRACT

A semiconductor device includes a semiconductor substrate; a first electrode formed over the semiconductor substrate; a first insulation film covering the first electrode and having an aperture for exposing a part of the first electrode; a first conductive film formed on a part of the first insulation film and the first electrode inside the aperture; an isolation region placed inside the aperture; and a second conductive film formed on the first conductive film and the isolation region.

17 Claims, 27 Drawing Sheets

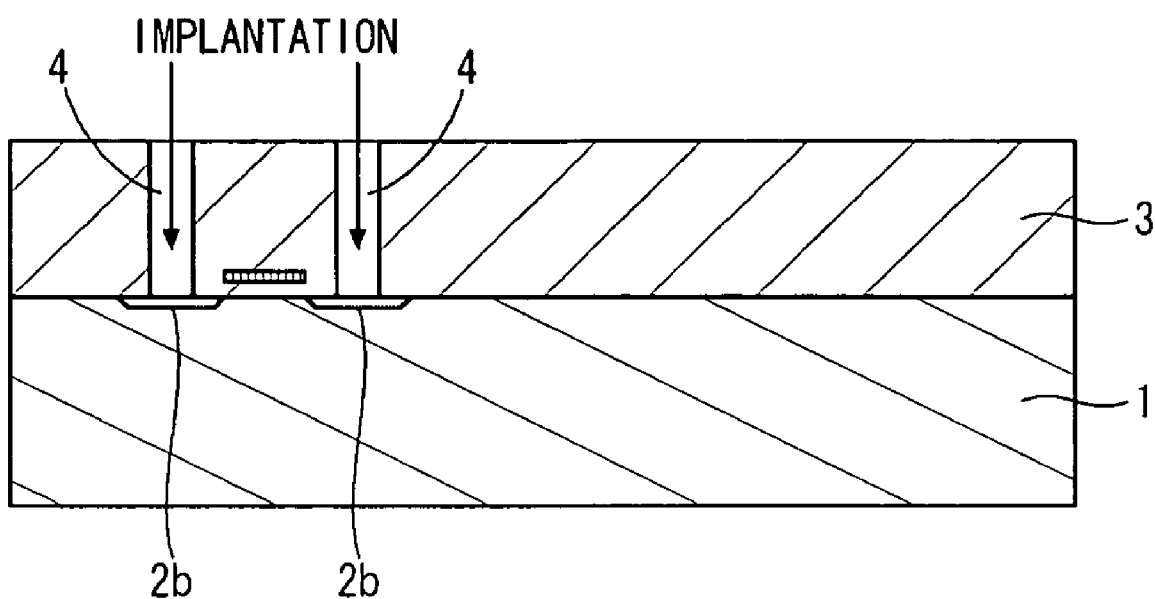

$D = 2*(t1 + t2)$
$\Downarrow$
$t1 = D/2 - t2$

SEMICONDUCTOR DEVICE AND A METHOD OF MANUFACTURING THE SAME

BACKGROUND OF THE INVENTION

1. Field of the Invention

The present invention relates to a semiconductor device and a method of manufacturing the same. More specifically, the present invention relates to a wiring structure of a capacitor including a metal oxide dielectric material.

2. Background Information

A FeRAM (Ferroelectric Random Access Memory) is a high-speed nonvolatile memory using a hysteresis characteristic of a ferroelectric material. The FeRAM is outstanding in that it has the ability to write as fast as a DRAM (Dynamic Random Access Memory), consume little power, and so forth.

Further, in case of forming a capacitor using a ferroelectric material, i.e. a metal oxide, annealing at high temperature (600 to 800 degrees C.) in an oxygenated environment is required for sintering the ferroelectric material and recovering the characteristic of the ferroelectric material after etching. Taking this into account, both of two electrodes contacting the ferroelectric material are made of a noble metal such as platinum (Pt), iridium (Ir), and so forth, which has high oxidation resistance. In particular, platinum (Pt) has high stability and workability, so that it is most often used in the electrodes.

For example, a wiring structure of a ferroelectric capacitor having platinum electrodes is shown in Japanese Laid Open Patent Publication No. 10-256503, which is hereby incorporated by reference. According to the wiring structure as disclosed in Publication No. 10-256503, a main wiring material is aluminum (Al) and a main electrode material is platinum (Pt). In general, aluminum (Al) and platinum (Pt) are known to overreact with each other. Such overreaction may cause voids on the aluminum wirings. Moreover, if the reactions between the aluminum (Al) and platinum (Pt) are excessive, the aluminum wirings may break away. In this respect, the wiring structure as disclosed in Publication No. 10-256503 has a protective layer on the capacitor electrode in order to prevent the aluminum (Al) and platinum (Pt) from overreacting with each other.

As described above, platinum (Pt) used as an electrode material of a ferroelectric capacitor overreacts with aluminum (Al), which is a common wiring material. This overreaction causes voids on the aluminum wirings. Moreover, if the reactions between the aluminum (Al) and platinum (Pt) are excessive, the aluminum wirings may break away. For this sake, generally, a barrier film like titanium nitride (TiN) film is arranged between the platinum electrode and the aluminum wiring. However, since the crystal structure of titanium nitride (TiN) is a columnar crystal structure, aluminum atoms can easily diffuse through intergranular spaces of the TiN crystal grains. Thus, uniformly forming a titanium nitride film at the interface between the platinum electrode and the aluminum wiring does not provide a sufficient barrier effect.

The wiring structure according to Publication No. 10-256503 has a protective layer for preventing possible reactions between the platinum electrode and the aluminum wiring of the capacitor. The protective layer is constructed with a barrier layer, a stopper layer, and an adhesion layer. However, when the protective layer is formed, it is integrated with the capacitor electrode at the upper part of this capacitor electrode. This makes the capacitor electrode thicker, which in turn makes the whole structure of the capacitor thicker.

Furthermore, according to Publication No. 10-256503, an etching process is carried out for forming a contact hole to connect electrically the capacitors electrodes and the wirings after forming the protective layer. However, a ferroelectric film can be damaged in this etching process. In order to recover the characteristic of the ferroelectric film, annealing at high temperature in an oxygen environment is needed. However, this annealing can cause oxidation of the protective layer which has already been formed. This oxidation may cause deterioration in the electrical characteristic of the protective layer and abruption of the protective layer.

Moreover, in Publication No. 10-256503, with respect to the capacitor structure of a stack type, the protective layer is formed only for the upper electrode of the capacitor. However, in a structure where both of the upper and lower electrodes of the capacitor are electrically pulled out upward by contacts, a protective layer should also be formed for the lower electrode of the capacitor. Publication No. 10-256503 does not disclose forming a protective layer for the lower electrode.

In view of the above, it will be apparent to those skilled in the art from this disclosure that there exists a need for an improved semiconductor device and an improved method of manufacturing the same. This invention addresses this need in the art as well as other needs, which will become apparent to those skilled in the art from this disclosure.

SUMMARY OF THE INVENTION

It is therefore an object of the present invention to resolve the above-described problems, and to provide a semiconductor device which has a barrier structure for preventing possible reactions between two metals which are used as electrode material. It is also an object of the present invention to provide a method of manufacturing a semiconductor device which is suitable for manufacturing a semiconductor device having a barrier structure to prevent possible reactions between two metals which are used as electrode material.

In accordance with a first aspect of the present invention, a semiconductor device has: a semiconductor substrate; a first electrode formed over the semiconductor substrate; a first insulation film covering the first electrode and having an aperture to expose a part of the first electrode; a first conductive film formed on a part of the first insulation film and the first electrode inside the aperture; an isolation region placed inside the aperture; and a second conductive film formed on the first conductive film and the isolation region.

In accordance with a second aspect of the present invention, a method of manufacturing a semiconductor device includes: preparing a semiconductor substrate; forming a first electrode over the semiconductor substrate; forming a first insulation film on the first electrode, the first insulation film having an aperture to expose a part of the first electrode; forming a first conductive film on a part of the first insulation film and the first electrode inside the aperture; forming a second insulation film inside the aperture; and forming a second conductive film on the first conductive film and the second insulation film.

In accordance with a third aspect of the present invention, a method of manufacturing a semiconductor device includes: preparing a semiconductor substrate; forming a first electrode over the semiconductor substrate; forming a first insulation film on the first electrode, the first insulation film having an aperture to expose a part of the first electrode; forming a first conductive film on a part of the first insulation film and inside the aperture, the first conductive film closing the top of the aperture; and forming a second conductive film on the first conductive film.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIGS. 2a to 2k show cross-sectional views of processes for manufacturing a ferroelectric memory cell according to the first embodiment of the present invention;

DETAILED DESCRIPTION OF THE PREFERRED EMBODIMENTS

Figure 1:
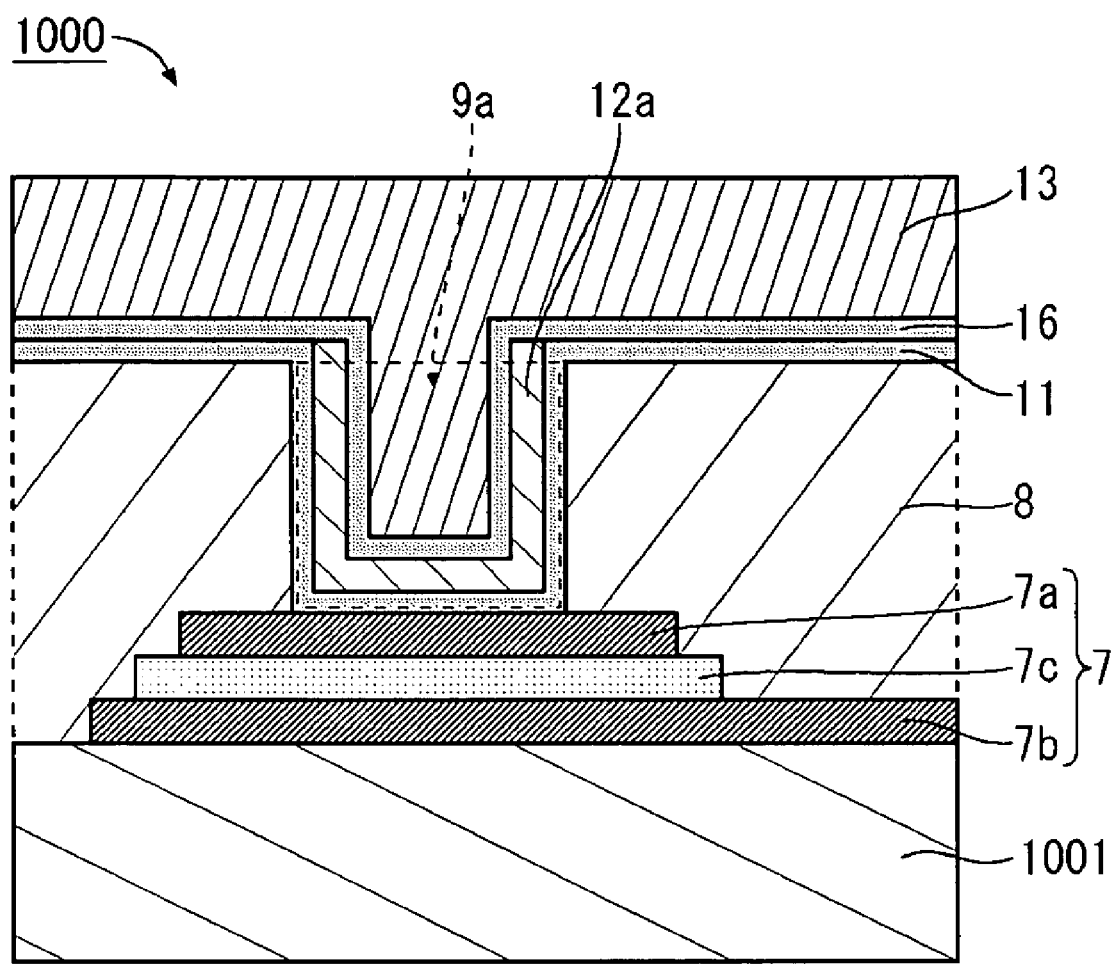
FIG. 1 shows a cross-sectional view of a ferroelectric capacitor according to a first preferred embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

(1) First Embodiment

Wiring Structure

FIG. 1 shows a wiring structure of a semiconductor device according to a first embodiment of the present invention. In the following, a semiconductor device having a ferroelectric capacitor 1000 will be described as an example of the structure of the present invention.

As shown in FIG. 1, the ferroelectric capacitor 1000 has a capacitor unit 7 built on a semiconductor substrate 1001. The capacitor unit 7 is constructed from a lower electrode (second electrode) 7b formed on the semiconductor substrate 1001, a capacity insulation film 7c formed on the lower electrode 7b and an upper electrode (first electrode) 7a formed on the capacity insulation film 7c. The upper electrode 7a and the lower electrode 7b are capacitor electrodes that are made of a material that exhibits outstanding oxidation resistance ability. For example, Pt (platinum) can be the major, i.e. at least 50% wt, component of those electrodes. The capacity insulation film 7c is preferably a metal oxide ferroelectric film. For example, the capacity insulation film 7c may be made of SBT (tantalic acid strontium bismuth: $SrBi_2Ta_2O_9$), or the like.

The ferroelectric capacitor 1000 further has an insulation film (first insulation film) 8, a conductive film (first conductive film) 11, a conductive film 16, an insulation film (second insulation film) 12a, and a conductive film (second conductive film) 13.

The insulation film 8 is, for example, a silicon oxide ($Si_xO_y$) film, and covers the capacitor unit 7. This insulation film 8 has a contact aperture 9a. The contact aperture 9a is an opening provided to expose a part of the top face of the upper electrode 7a. The upper electrode 7a is connected with other elements via an electric conductor, i.e. the conductive films 11 and 16 each formed in the contact aperture 9a.

The conductive film 11 is formed on a part of the insulation film 8 and inside the contact aperture 9a. This conductive film 11 is a barrier film provided to control possible reactions between the upper electrode 7a and the conductive film 13 which will be described later. The conductive film 16 is formed on the conductive film 11 and inside the contact aperture 9a. This conductive film 16 is also a barrier film to control possible reactions between the upper electrode 7a and the conductive film 13. Main components of the conductive films 11 and 16 are, for example, titanium nitride (TiN). However, the conductive film 16 can be omitted in this case.

The insulation film 12a is formed only on the conductive film 11 inside the contact aperture 9a. This insulation film 12a is an isolation region placed inside the aperture. As with the conductive film 11, the insulation film 12a serves as a barrier film to control possible reactions between the upper electrode 7a and the conductive film 13. The insulation film 12a is, for example, a silicon oxide ($Si_xO_y$) film. Moreover, the insulation film 12a may be a silicon nitride ($Si_xN_y$) film, a silicon oxynitride ($Si_xO_yN_z$) film, or a silicon carbide ($Si_xC_y$) film.

The conductive film 13 is a main wiring film, and it is formed on the conductive film 11 and on the insulation film 12a inside the contact aperture 9a. The main component of the conductive film 13, for example, may be Al (aluminum). Moreover, the major component of the conductive film 13 may be Cu (copper) or an alloy which is made of either Al (aluminum) or Cu (copper).

In this way, in the wiring structure of the ferroelectric capacitor 1000 according to the first embodiment of the present invention, a silicon oxide ($Si_xO_y$) film (insulation film 12a), which is far more superior than the typical titanium nitride (TiN) film in terms of barrier ability, is used as a barrier film in addition to the usual titanium nitride (TiN) film (conductive film 11). Due to this multiple barrier structure (i.e. a double barrier structure shown in FIG. 1), possible reactions between Al (aluminum) and Pt (platinum) can be controlled effectively.

Manufacturing Method

Next, a method of manufacturing a ferroelectric memory cell 100 according to the first embodiment of the present invention will be explained. FIGS. 2a to 2k show simplified cross-sectional views of the ferroelectric memory cell 100 in terms of manufacturing processes. The ferroelectric memory cell 100 is an example of a semiconductor device, and it is constructed from the ferroelectric capacitor 1000 as shown in FIG. 1 and a MOS transistor 2 which will be mentioned later.

Figure 2A:
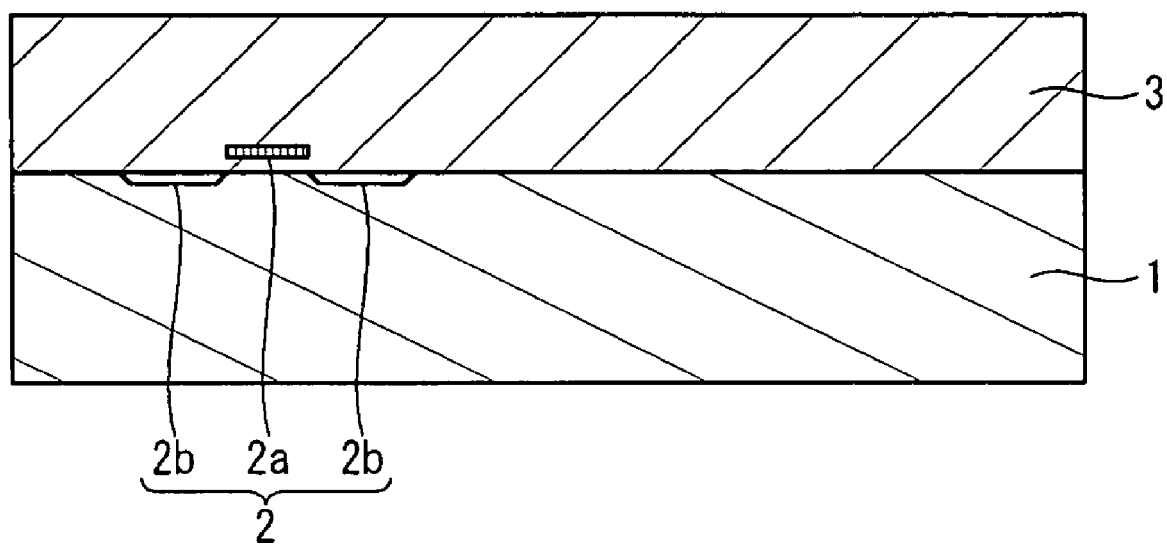

First, as shown in FIG. 2a, an MOS transistor 2 is formed on a semiconductor substrate 1. The MOS transistor 2 has a gate electrode 2a and two diffusion layers 2b where one is a drain region and the other is a source region. Some composition elements of the MOS transistor 2 are not shown in FIG. 2a for the sake of convenience of explanation.

Next, an insulation film 3 is formed on the semiconductor substrate 1 on which the MOS transistor 2 was formed. In forming the insulation film 3, first, a BPSG (boron phosphorous silicate glass) film is deposited to a thickness of 1200 nm by a CVD (chemical vapor deposition) method, and then reflowed by a thermal treatment of 20 minutes in $N_2$ (nitrogen) atmosphere at a temperature of 850 degrees C. This planarizes the surface of the BPSG film.

Next, SOG (spin on glass) is applied on the BPSG film to a film thickness of 470 nm, and then the whole surface is etched back. Thereby, the insulated film 3 with a film thickness of 850 nm is formed. As for the gas necessary for the etch-back process, for instance, $C_4F_8$ (octafluorocyclobutane), Ar (argon), $O_2$ (oxygen) and CO (carbon monoxide) can be used. The conditions of the etch-back process are, for instance, set to $C_4F_8$/Ar/$O_2$/CO=14/100/150/5 sccm (standard cc/min) for a gas flow rate, 1.5 kW (kilo watt) for RF power and 50 mTorr (mili Torr) for pressure inside the chamber.

Next, as shown in FIG. 2b, contact apertures 4 that expose a part of the diffusion layer 2b of the drain region and the source region of the MOS transistor 2, respectively, are formed by photolithography and etching. As for the gas necessary for the etching process, for example, $CHF_3$ (trifluoromethane), $CF_4$ (carbon tetrafluoride), and Ar (argon) can be used. The conditions of the etching process are, for instance, set to $CHF_3$/$CF_4$/Ar=40/15/400 sccm for a gas flow rate, 800 W for RF power and 500 mTorr for pressure inside the chamber.

Next, a contact implant, using a material such as $P^+$ and $BF_2^+$, is performed, and a thermal treatment is performed for 10 seconds at a temperature of 1000 degrees C.

Figure 2C:
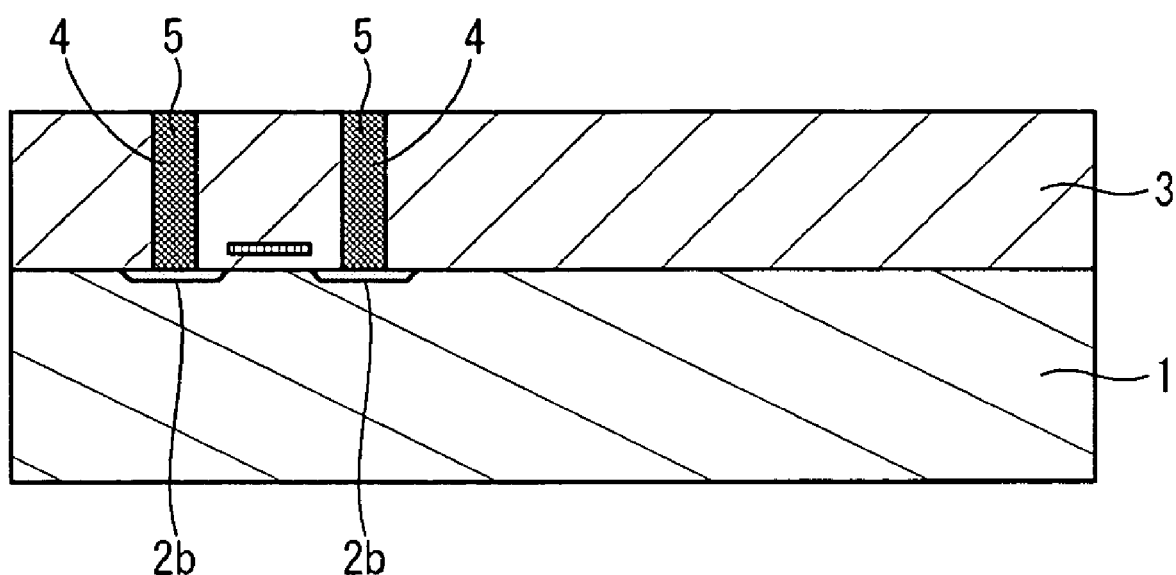

Next, as shown in FIG. 2c, an electrical plug 5 is formed inside the contact aperture 4. In the process of forming the electrical plug 5, first, a film stack having a Ti (titanium) film and a titanium nitride (TiN) film is formed by the CVD method. Here the Ti (titanium) film is preferably 15 nm thick and the titanium nitride (TiN) film is preferably 20 nm thick.

A formation method of the Ti (titanium) film is as follows. As for the gas necessary to form the Ti (titanium) film, for instance, $TiCl_4$ (titanium tetrachloride), Ar (argon), and $H_2$ (hydrogen) can be used. The conditions of the deposition process are, for instance, set to $TiCl_4$/Ar/$H_2$=5/350/1500 sccm for a gas flow rate, 350 W for RF power, 5 Torr for pressure inside the chamber and 630 degrees C. for a stage temperature. After the Ti (titanium) film is formed, this Ti (titanium) film is nitrided within the same chamber. As for the gas necessary for the nitriding process, for example, $NH_3$ (ammonia), $N_2$ (nitrogen), and Ar (argon) can be used. The conditions of the nitiriding process are, for instance, set to $NH_3$/$N_2$/Ar=500/250/350 sccm for a gas flow rate, 500 W for RF power, 5 Torr for pressure inside the chamber, and 630 degrees C. for a stage temperature.

On the other hand, a formation method of the TiN film is as follows. As for the gas necessary for forming the TiN film, for instance, $TiCl_4$ (titanium tetrachloride), $NH_3$ (ammonia), and Ar (argon) can be used. The conditions of the deposition process are, for instance, set to $TiCl_4$/$NH_3$/Ar=35/400/350 sccm for a gas flow rate, 300 mTorr for pressure inside the chamber and 680 degrees C. for a stage temperature. After the TiN (titanium nitride) film is formed, this TiN (titanium nitride) film is annealed within the same chamber by thermal treatment for the purpose of dechlorination and resistance reduction. As for the gas necessary for the thermal treatment, for example, $NH_3$ (ammonia) and $N_2$ (nitrogen) can be used. The conditions of the thermal treatment are, for instance, set to $NH_3$/$N_2$=4000/400 sccm for a gas flow rate, 8 Torr for pressure inside the chamber, and 680 degrees C. for a stage temperature. Thus the Ti (titanium) film and the TiN (titanium nitride) film can be formed as described above.

Then, a W (tungsten) film is deposited on the TiN (titanium nitride) film to a thickness of 600 nm by the CVD method. The process of forming the W (tungsten) film can be divided into two steps. In the first step of the process, for example, $WF_6$ (hexafluoride tungsten) and $SiH_4$ (monosilane) are used as the gas. The conditions of the deposition process are, for instance, set to $WF_6$/$SiH_4$=300/100 sccm for a gas flow rate, 300 mTorr for pressure inside the chamber, and 400 degrees C. for a stage temperature. In the second step of the deposition process, for example, $WF_6$ (hexafluoride tungsten) and $H_2$ (hydrogen) are used as the gas. The conditions of the deposition process are, for instance, set to $WF_6$/$H_2$=500/6500 sccm for a gas flow rate, 30 Torr for pressure inside the chamber, and 400 degrees C. for a stage temperature. At this point, formation of a film stack constructed from the Ti (titanium) film, the TiN (titanium nitride) film, and the W (tungsten) film comes to completion.

Then, by carrying out an etch-back process on the film stack constructed from the Ti (titanium) film, the TiN (titanium nitride) film and the W (tungsten) film, the electrical plug 5 is formed as shown in FIG. 2c. As for the gas necessary for this etch-back process, for instance, $SF_6$ (hexafluoride sulfur) and $O_2$ (oxygen) can be used. Moreover, the conditions of the etch-back process are, for instance, set to $SF_6$/$O_2$=250/50 sccm for a gas flow rate, 300 W for RF power and 150 mTorr for pressure inside the chamber.

Figure 2D:
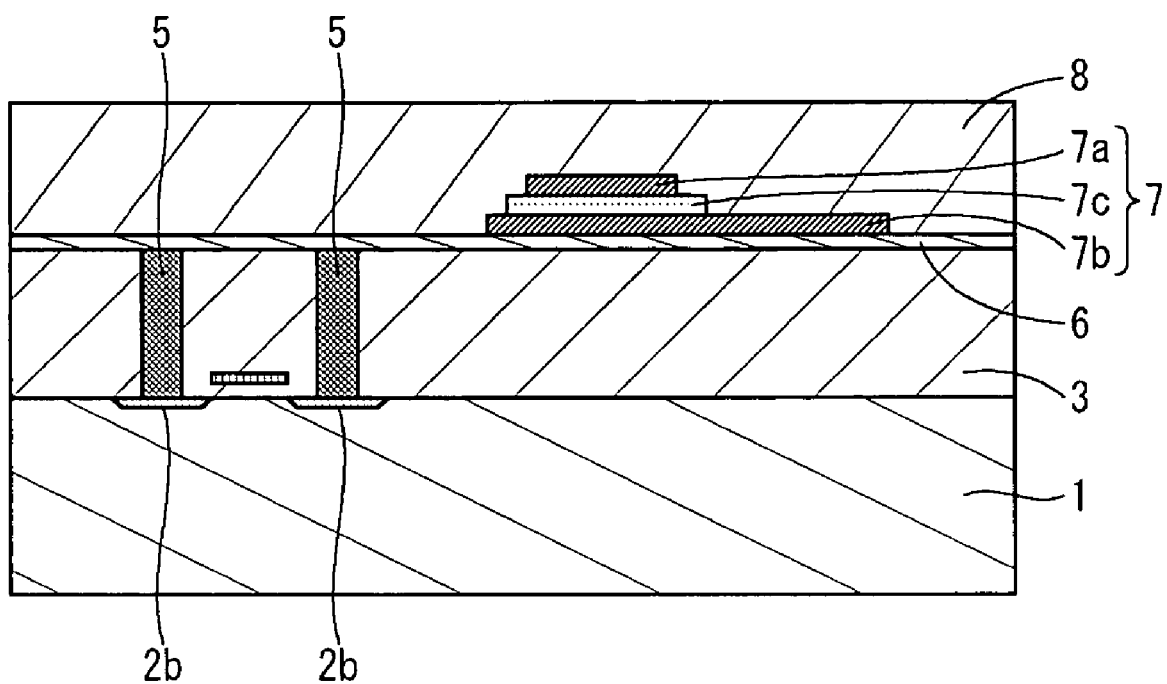

Next, as shown in FIG. 2d, a capacitor unit 7 is formed. First of all, an insulation film 6 is formed over the whole surface by sputtering. The insulation film 6 is an adhesion layer for a lower electrode 7b of the capacitor unit 7, which is to be described later. The insulation film is, for example, a $Ta_xO_y$ (tantalum oxide) film. In forming the $Ta_xO_y$ (tantalum oxide) film, for example, Ta (tantalum) is used as a sputtering target and a mixed gas of Ar (argon) and $O_2$ (oxygen) is used as a sputtering gas. The conditions of the deposition process are, for example, set to 1.6 kW for RF power, 9.5 mTorr for pressure of sputter atmosphere, and 200 degrees C. for deposition temperature.

Next, the capacitor unit 7, which is constructed from an upper electrode 7a, the lower electrode 7b and a capacity insulation film 7c, is formed on the insulation film 6. In forming the capacitor unit 7, first a Pt (platinum) film, which is to serve as the lower electrode 7b, is formed to a thickness of 150 nm by sputtering. In forming the Pt (platinum) film, for instance, Pt (platinum) is used as a sputtering target and Ar (argon) is used as a sputtering gas. The conditions of the deposition process are, for example, set to 1 kW for RF power, 10 mTorr for pressure of sputter atmosphere, and 200 degrees C. for deposition temperature. Next, a metal oxide ferroelectric film, which is to serve as the capacity insulation film 7c, is formed to a thickness of 120 nm. The capacity insulation film 7c is, for example, an SBT (tantalic acid strontium bismuth: $SrBi_2Ta_2O_9$) film. The SBT film can be formed, for instance, by spin coating a precursor solution in which SBT is dissolved, evaporating and removing the solution by drying it for five minutes on a hot plate maintained at a temperature of 150 to 200 degrees C., and performing a thermal treatment by a calcination furnace at 800 degrees C. and in the oxygen environment for 30 minutes to crystallize the SBT. Next, a Pt (platinum) film, which is to serve as the upper electrode 7a, is formed to a thickness of 200 nm by sputtering. In forming the Pt (platinum) film, for instance, Pt (platinum) is used as a sputtering target and Ar (argon) is used as a sputtering gas.

The conditions of the deposition process are, for example, set to 1 kW for RF power, 10 mTorr for pressure of sputter atmosphere, and 200 degrees C. for deposition temperature. At this point, formation of a film stack of the capacitor being made of the Pt (platinum) film (lower electrode 7b), the SBT film (capacity insulation film 7c), and the Pt (platinum) film (upper electrode 7a) comes to completion.

Then, the Pt (platinum) film (upper electrode 7a), the SBT film (capacity insulation film 7c), and the Pt (platinum) film (lower electrode 7b) are patterned by photo-lithography and etching sequentially. As for the gas necessary for etching the upper electrode 7a made of Pt (platinum), for instance, $Cl_2$ (chlorine) and Ar (argon) can be used. The conditions of the etching process are, for instance, set to $Cl_2/Ar=10/10$ sccm for a gas flow rate, 120 to 500 W for RF power, and 5 mTorr for pressure inside the chamber. As for the gas necessary to etch the capacity insulation film 7c made of SBT, for instance, $Cl_2$ (chlorine), Ar (argon), HBr (hydrogen bromide), and $O_2$ (oxygen) can be used. The conditions of the etching process are, for instance, set to $Cl_2/Ar/HBr/O_2=5/12/3/3$ sccm for a gas flow rate, 100 to 800 W for RF power, and 2 mTorr for pressure inside the chamber. As for the gas necessary to etch the lower electrode 7b made of Pt (platinum), for instance, $Cl_2$ (chlorine) and Ar (argon) can be used. The conditions of the etching process are, for instance, set to $Cl_2/Ar=10/10$ sccm for a gas flow rate, 120 to 500 W for RF power, and 5 mTorr for pressure inside the chamber. At this point, formation of the capacitor unit 7 constructed from the upper electrode 7a, the lower electrode 7b and the capacity insulation film 7c, as shown in FIG. 2d, comes to completion. Then, an insulation film 8 being a silicon oxide ($Si_xO_y$) film is formed on the whole surface by the CVD method.

Figure 2E:
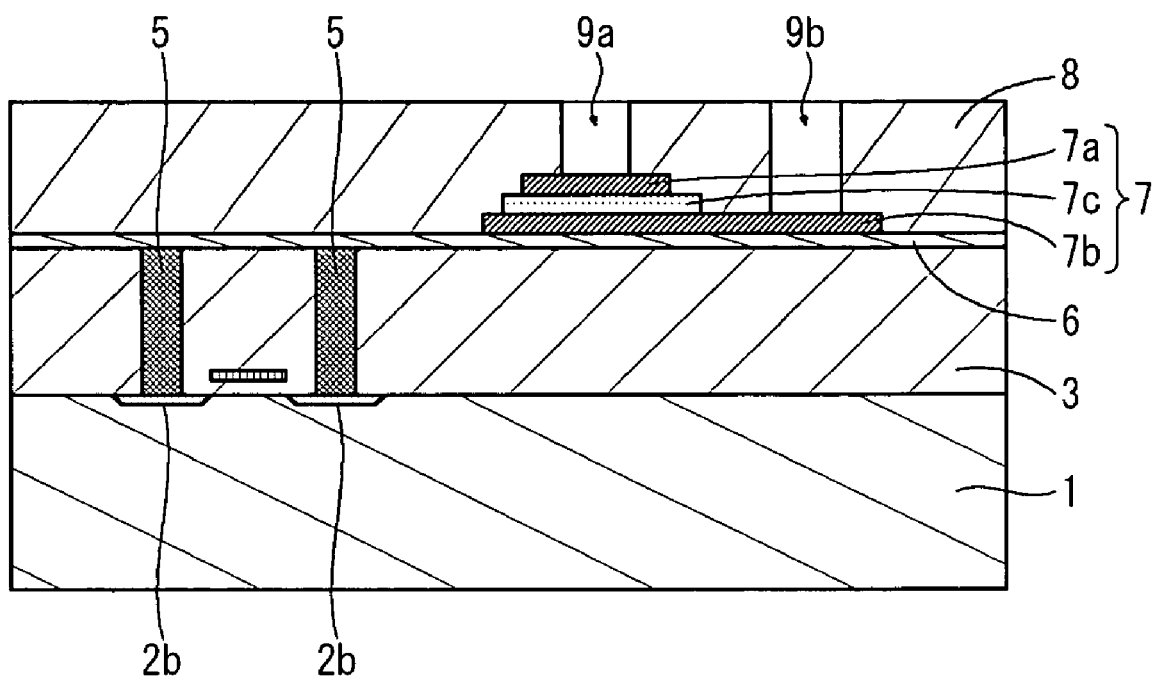

Next, as shown in FIG. 2e, a contact aperture 9a that exposes a part of the upper electrode 7a of the capacitor unit 7 and a contact aperture 9b that exposes a part of the lower electrode 7b are formed by photo-lithography and etching. As for the gas necessary for the etching process, for example, $CHF_3$ (trifluoromethane), $CF_4$ (carbon tetrafluoride) and Ar (argon) can be used. The conditions of the etching process are, for instance, set to $CHF_3/CF_4/Ar=80/15/400$ sccm for a gas flow rate, 800 W for RF power, and 500 mTorr for pressure inside the chamber. After the contact apertures 9a and 9b are formed, a thermal treatment of one hour in an oxygen environment at a temperature of 600 to 750 degrees C. is performed in order to recover the metal oxide ferroelectric characteristic.

Figure 2F:
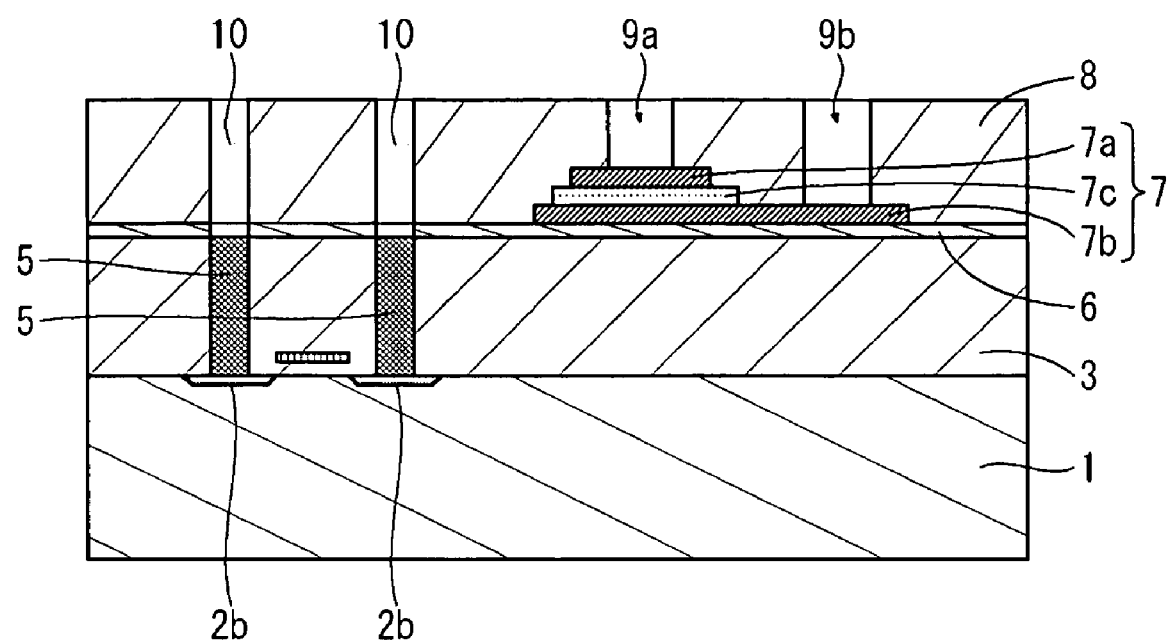

Next, as shown in FIG. 2f, contact apertures 10 that expose the upper surface of the electrical plug 5 are formed by photo-lithography and etching. As for the gas necessary for the etching process, for example, $CHF_3$ (trifluoromethane), $CF_4$ (carbon tetrafluoride), and Ar (argon) can be used. The conditions of the etching process are, for instance, set to $CHF_3/CF_4/Ar=80/15/400$ sccm for a gas flow rate, 800 W for RF power and 500 mTorr for pressure inside the chamber.

Figure 2G:
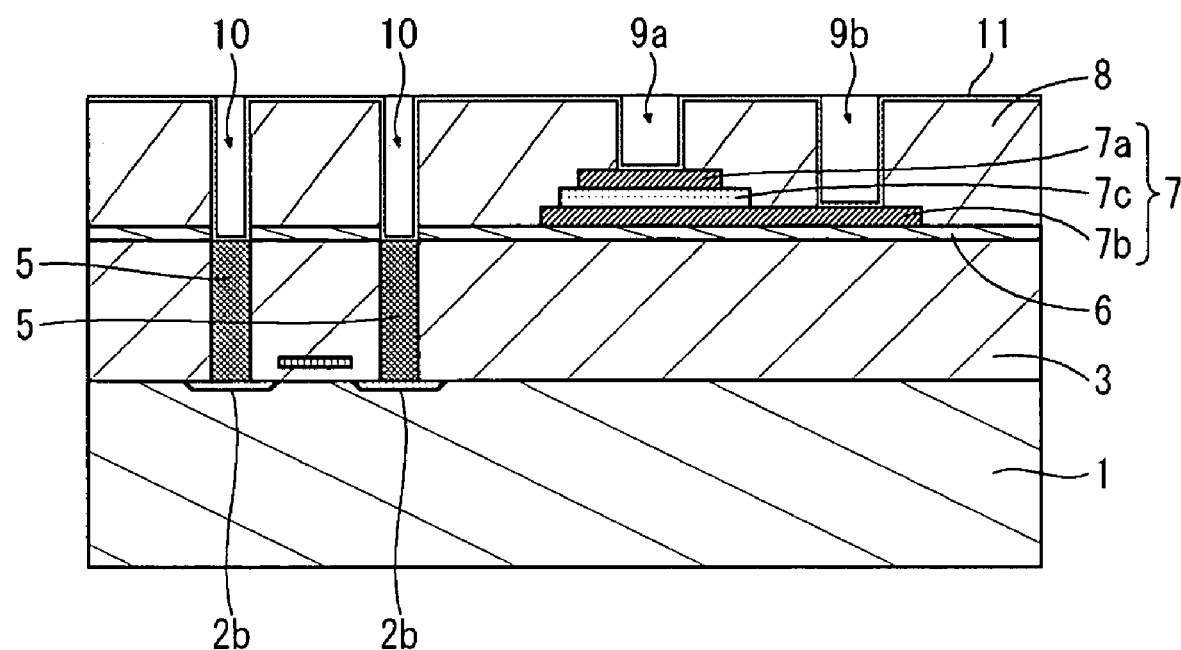

Next, as shown in FIG. 2g, a conductive film 11 is formed by sputtering in a way such that the conductive film 11 covers the upper surface of the insulation film 8 and the insides of the contact apertures 9a, 9b, and 10. The conductive film 11 is a barrier film to control possible reactions between the upper electrode 7a and a conductive film 13, which is to be described later. In this case, the conductive film 11 is made of TiN (titanium nitride). The thickness of the conductive film 11 (i.e. the TiN film) is 75 nm. In forming the conductive film (the TiN film) 11, for example, Ti (titanium) is used as a sputtering target and $N_2$ (nitrogen) is used as a sputtering gas. The conditions of the deposition process are, for example, set to 1.6 kW for DC power, 7 mTorr for pressure of sputter atmosphere and 200 degrees C. for deposition temperature.

Figure 2H:
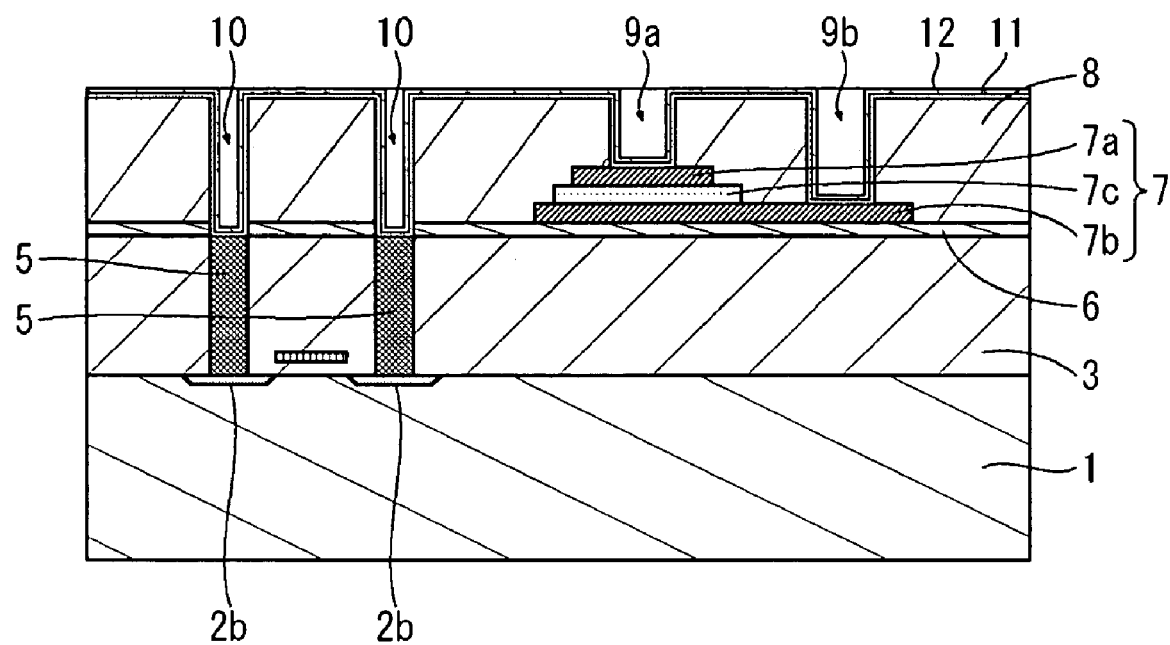

Next, as shown in FIG. 2h, an insulation film 12 is formed on the conductive film 11 by the CVD method. As with the conductive film 11, the insulation film 12 is a barrier film to control possible reactions between the upper electrode 7a and the conductive film 13. The insulation film 12 in this case is a silicon oxide ($Si_xO_y$) film. In addition, in this particular embodiment, a $SiO_2$ film of P-TEOS (plasma-tetra ethyl ortho silicate) is used as the insulation film 12. The thickness of the insulation film 12 is 10 to 50 nm. As for the material of the insulation film 12, instead of using silicon oxide ($Si_xO_y$), it is also possible to use silicon nitride ($Si_xN_y$), silicon oxynitride ($Si_xO_yN_z$), or silicon carbide ($Si_xC_y$) as a major component.

Figure 2I:
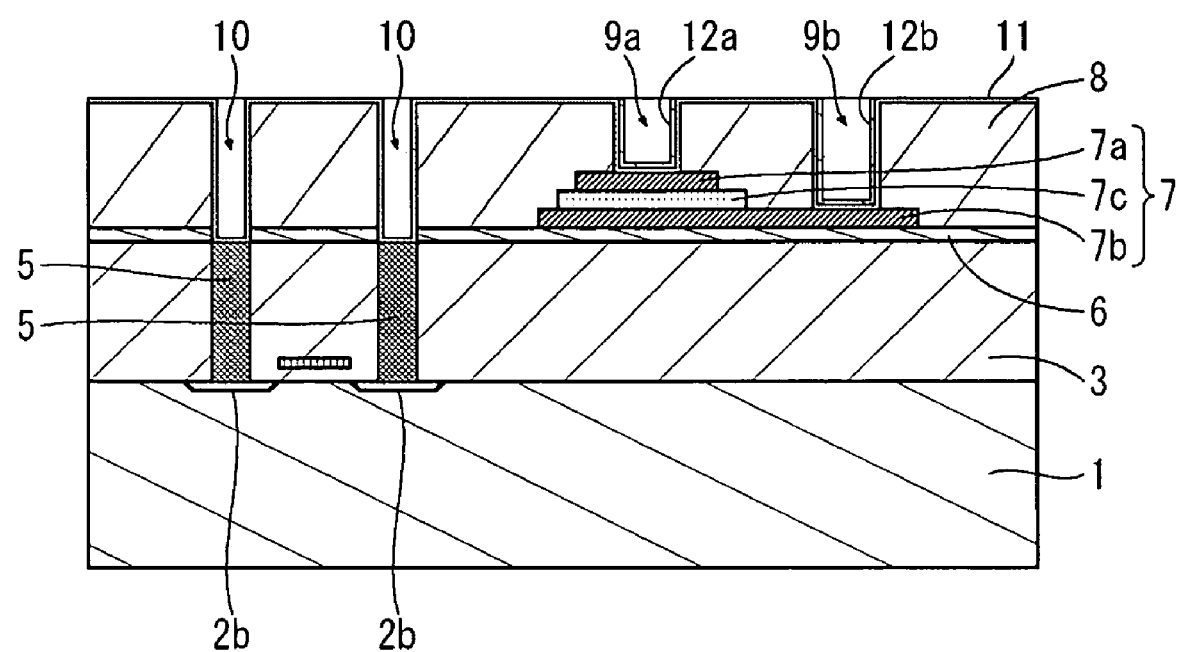

Next, as shown in FIG. 2i, the whole insulation film 12 except for the parts (insulation films 12a and 12b) covering the insides of the contact apertures 9a and 9b is removed by photo-lithography and etching. As for the gas necessary for the etching process, for example, $C_4F_8$ (octafluorocyclobutane), Ar (argon), $O_2$ (oxygen), and CO (carbon monoxide) can be used. The conditions of the etching process are, for instance, set to $C_4F_8/Ar/O_2/CO=14/100/150/5$ sccm for a gas flow rate, 1.5 kW for RF power, and 50 mTorr for pressure inside the chamber. In this etching process, by using the etching gas of $C_4F_8$ (octafluorocyclobutane) system, etching rate of the TiN (titanium nitride) film as opposed to the silicon oxide ($SiO_2$) film can be decreased by 1/50 or less. Therefore, in the regions excepting the insides of the contact apertures 9a and 9b, it is possible to remove effectively the insulation film 12 made of silicon oxide ($Si_xO_y$) alone while leaving the conductive film 11 made of TiN (titanium nitride).

Figure 2J:
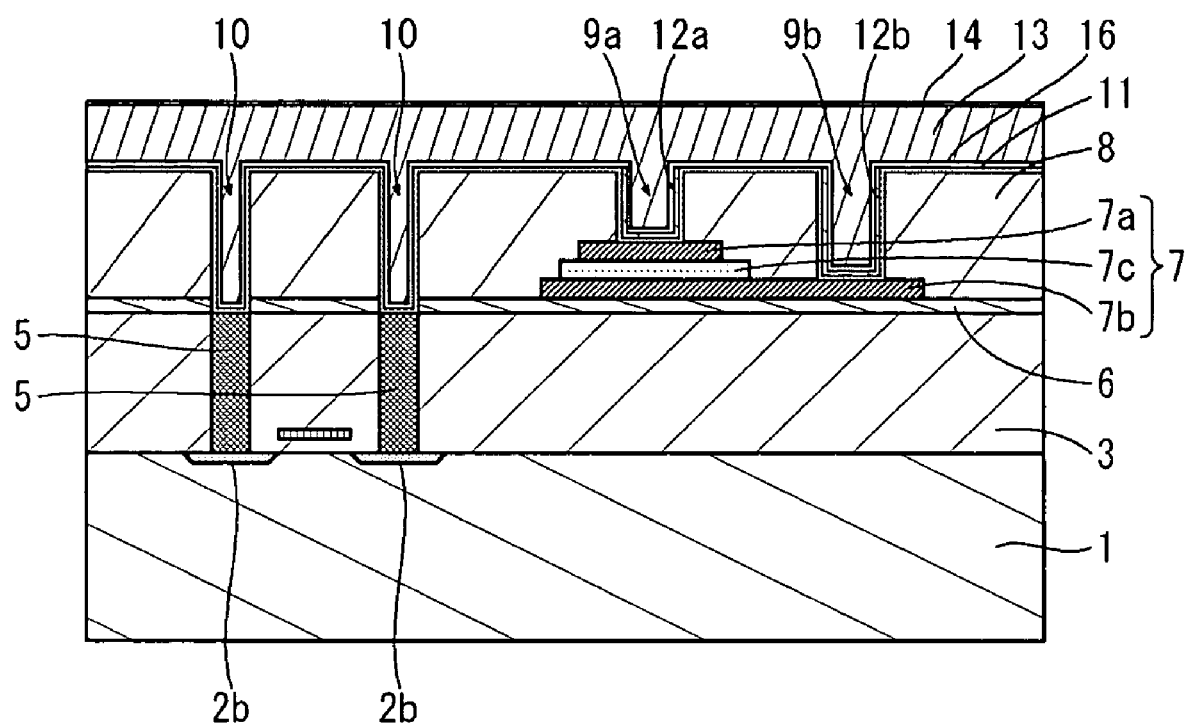

Next, as shown in FIG. 2j, conductive films 16, 13, and 14 are sequentially formed on the conductive film 11 and the insulation films 12a and 12b by sputtering.

In this case, the conductive film 16 is made of TiN (titanium nitride). The thickness of the conductive film 16 (the TiN film) is 75 nm. In forming the conductive film 16 (the TiN film), for example, Ti (titanium) is used as a sputtering target and $N_2$ (nitrogen) is used as a sputtering gas. The conditions of the deposition process are, for example, set to 5 kW for DC power, 7 mTorr for pressure of sputter atmosphere, and 100 degrees C. for deposition temperature. Although this particular embodiment uses the conductive film 16, it is also possible to omit the conductive film 16.

In this particular embodiment, the conductive film 13 is a main wiring film in which Al (aluminum) alloy is used as major component. The process of forming the Al (aluminum) alloy film can be divided into two steps. In the first step of the deposition process, for example, Al (aluminum) alloy is used as a sputtering target and Ar (argon) is used as a sputtering gas. The conditions of the deposition process are, for example, set to 9 kW for DC power, 3 mTorr for pressure of sputter atmosphere, and 400 degrees C. for deposition temperature. In the second step of the deposition process, for example, Al (aluminum) alloy is used as a sputtering target and Ar (argon) is used as a sputtering gas. The conditions of the deposition process are, for example, set to 2 kW for DC power, 3 mTorr for pressure of sputter atmosphere, and 400 degrees C. for deposition temperature. Here, as for the material of the conductive film 13, instead of using the Al (aluminum) alloy, it is also possible to use Al (aluminum), Cu (copper) or an alloy of which major component is Cu (copper).

The conductive film 14 is an antireflection film to prevent reflection on the conductive film 13. In this case, the conductive film 14 is made of TiN (titanium nitride). The thickness of the conductive film 14 (the TiN film) is 75 nm. In forming the conductive film 14 (the TiN film), for example, Ti (titanium) is used as a sputtering target and $N_2$ (nitrogen) is used as a sputtering gas. The conditions of the deposition process are, for example, set to 5 kW for DC power, 7 mTorr for pressure of sputter atmosphere, and 100 degrees C. for deposition temperature.

Figure 2K:
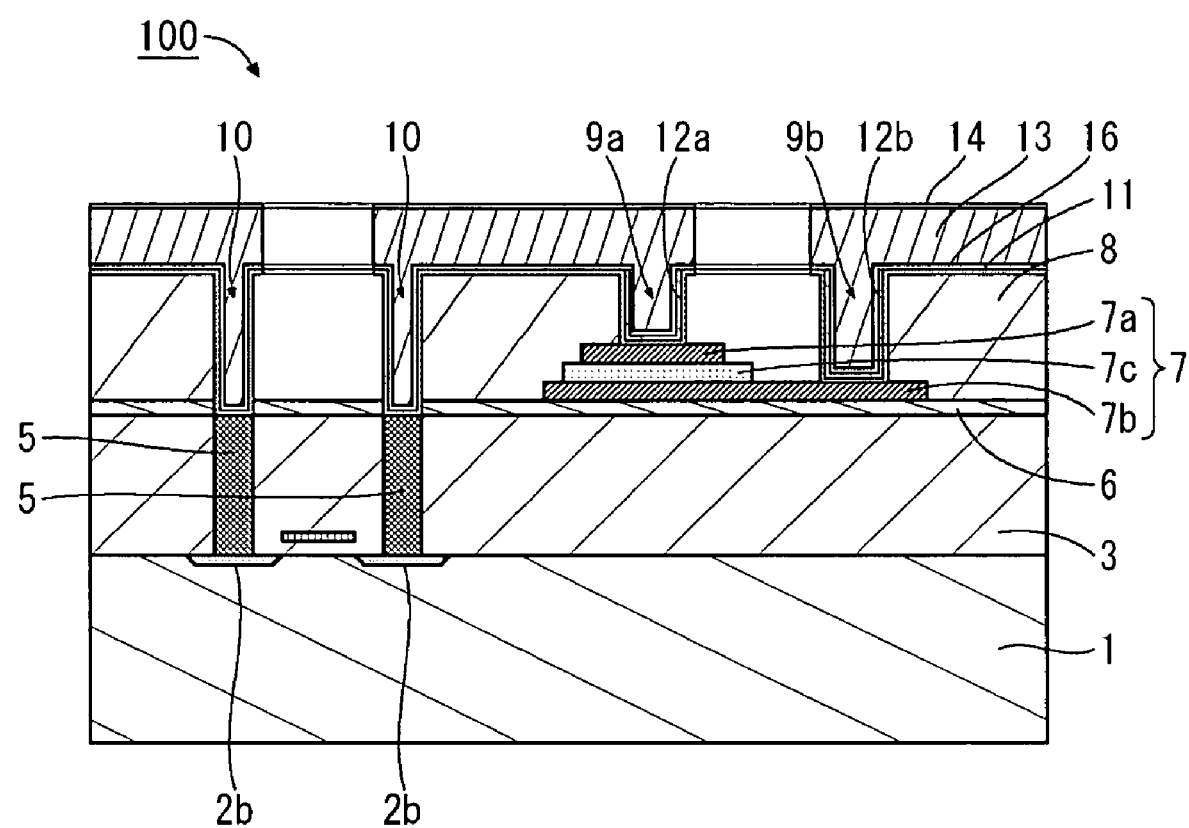

Then, as shown in FIG. 2k, the conductive films 11, 16, 13, and 14 are patterned by photo-lithography and etching. As for the gas necessary for the etching process, for instance, $BCl_3$ (boron trichloride) and $Cl_2$ (chlorine) can be used. The conditions of the etching process are, for instance, set to $BCl_3$/$Cl_2$=40/60 sccm for a gas flow rate, 70 W for RF power, and 1 Pa (pascal) for pressure inside the chamber.

Processes of forming interlayer insulation films, upper layer wirings, etc. are further repeated to form completely the ferroelectric memory cell 100. However, since those processes do not directly relate to the present invention, explanation will be omitted.

Operation Effect

In the wiring structure of the semiconductor device according to the first embodiment of the present invention, in addition to the conductive film 11, which is a typical barrier film made of TiN (titanium nitride), the insulation film 12a, which is an insulation film made of silicon oxide ($Si_xO_y$), is also applied in between the upper electrode 7a made of Pt (platinum) and the conductive film 13 made of Al (aluminum). Likewise, in addition to the conductive film 11, the insulation film 12b, which is an insulation film made of silicon oxide ($Si_xO_y$), is also applied between the lower electrode 7b made of Pt (platinum) and the conductive film 13 made of Al (aluminum). The diffusion velocity of Al (aluminum) atoms in a silicon oxide ($Si_xO_y$) film is very small, and barely poses any problem. Accordingly, such multiple barrier structure improves the barrier characteristic with respect to diffusion of Al (aluminum) atoms, and effectively controls possible reactions between Al (aluminum) and Pt (platinum).

Furthermore, since this multiple barrier structure applying the conductive film 11 and the insulation film 12a/12b is incorporated as a part of the wiring structure, surface level differences and thickening of the whole configuration of the semiconductor device should not be promoted.

Moreover, since the conductive film 11 (TiN barrier film) is formed after the annealing treatment in the oxygen environment, which is accompanied by the etching of the contact aperture 9a and 9b, reduction in the electric properties and abruption causing oxidation of the barrier film can be prevent.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

Alternate Embodiments

Alternate embodiments will now be explained. In view of the similarity between the first and second embodiments, the parts of the alternate embodiments that are identical to the parts of the first embodiment will be given the same reference numerals as the parts of the first embodiment. Moreover, the descriptions of the parts of the alternate embodiments that are identical to the parts of the first embodiment may be omitted for the sake of brevity.

(2) Second Embodiment

Wiring Structure

Figure 3:
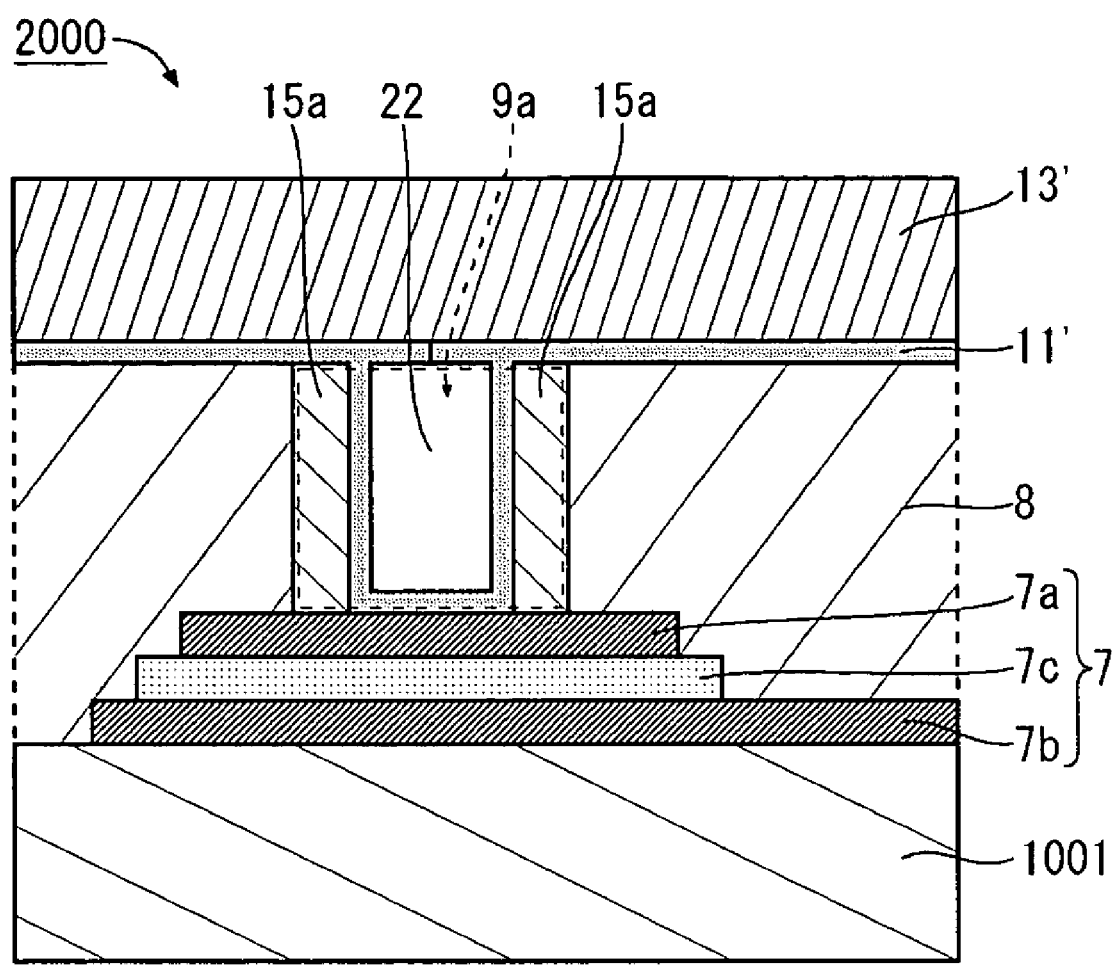
FIG. 3 shows a cross-sectional view of a ferroelectric capacitor according to a second preferred embodiment of the present invention.

FIG. 3 shows a wiring structure of a semiconductor device according to a second preferred embodiment of the present invention. In the following, a semiconductor device having a ferroelectric capacitor 2000 will be described as an example of the structure of the present invention. In FIG. 3 and the following related figures, as for the structure elements of the ferroelectric capacitor 2000 that are the same as those of the ferroelectric capacitor 1000 shown in FIG. 1 according to the first embodiment, the same reference numbers are to be used and redundant description on some of the same structure will be omitted.

As shown in FIG. 3, the ferroelectric capacitor 2000 has the capacitor unit 7 formed on the semiconductor substrate 1001 and the insulation film 8 covering the capacitor unit 7 as with the ferroelectric capacitor 1000. In this particular embodiment, the conductive films 11 and 13 are replaced with conductive films 11' and 13', respectively, the insulation film 12a and the conductive film 16 are eliminated, and an air gap 22 and a side wall film 15a are added.

The insulation film 8 has the contact aperture 9a to expose a part of the top face of the upper electrode 7a as with the first embodiment of the present invention. The upper electrode 7a is connected with other elements via an electric conductor i.e. the conductive film 11' formed in the contact aperture 9a. The side wall film 15a is formed on the side wall of the contact aperture 9a. The side wall film 15a is, for example, an insulation film made of silicon oxide ($Si_xO_y$). Moreover, the side wall film 15a may be made of silicon nitride ($Si_xN_y$), a silicon oxynitride ($Si_xO_yN_z$), or a silicon carbide ($Si_xC_y$). Furthermore, instead of serving as an insulation film, the side wall film 15a may serve as a conductive film made of titanium nitride ($Ti_xN_y$), tantalum nitride ($Ta_xN_y$), and so on.

The conductive film 11' is a barrier film to control possible reactions between the upper electrode 7a and the conductive film 13', which is to be described later. The conductive film 11' is formed on a part of the insulation film 8 and on the side wall of the side wall film 15a. The conductive film 11' is, for example, made of TiN (titanium nitride).

Figure 4:
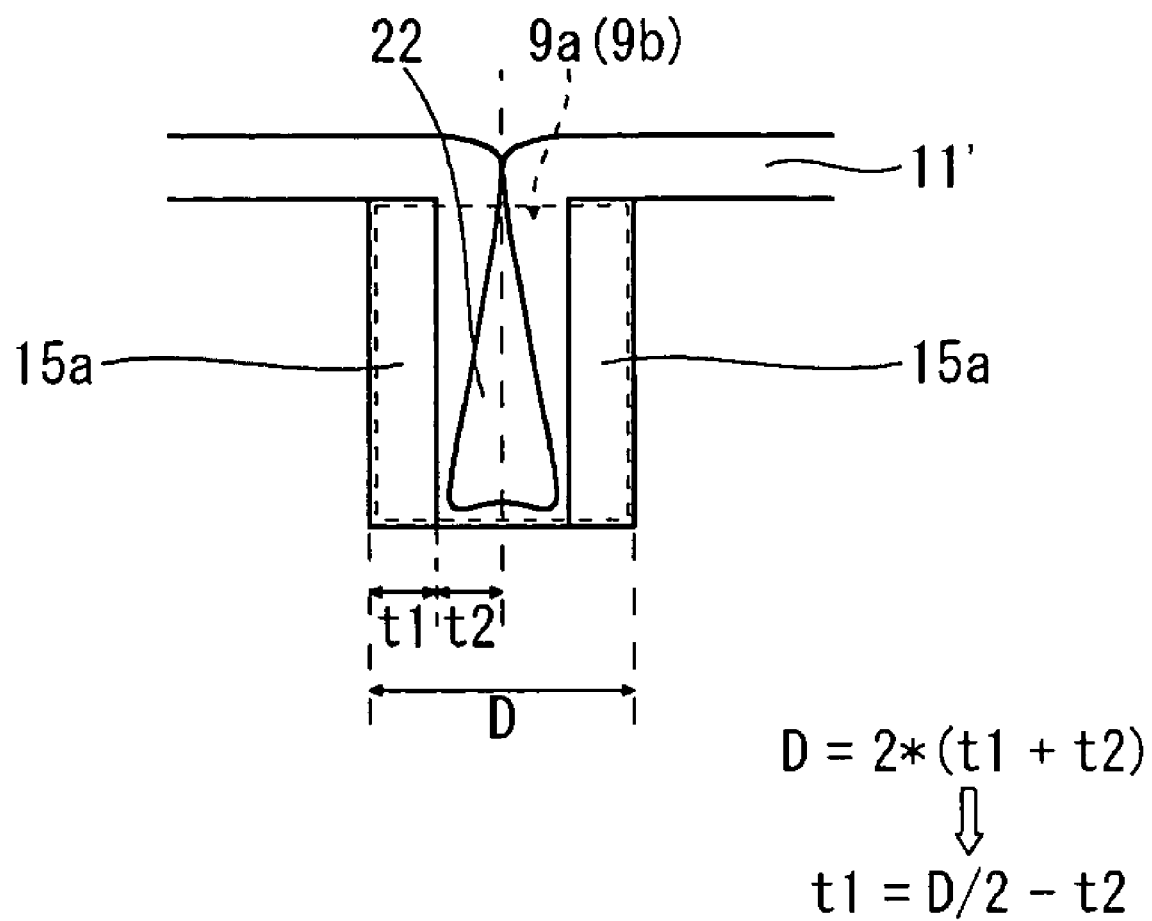
FIG. 4 shows a cross-sectional view of a contact aperture of the ferroelectric capacitor according to the second embodiment of the present invention.

In this description, as shown in FIG. 4, the diameter of the top of the contact aperture 9a is substantially narrowed by the side wall film 15a. In concrete terms, the semidiameter of the top of the contact apertures formed on the upper electrode 7a becomes smaller than a thickness of the conductive film 11' by the side wall films 15a. Therefore, the top of the contact aperture formed on the upper electrode 7a is completely closed by the conductive film 11', and the air gap 22 is formed inside the contact aperture 9a as shown in FIG. 4. This is the same with a contact aperture 9b that will be mentioned later. In the following, this point will be mentioned in more detail.

The conductive film 13' is a main wiring film and it is formed on the conductive film 11' except the inside of the contact aperture 9a. The major component of the conductive film 13' is, for example, Al (aluminum).

As described above, in the wiring structure according to the second embodiment of the present invention, the conductive film 13' made of Al (aluminum) is not formed inside the contact aperture 9a. In other words, the air gap 22 which is an isolation region is placed between the upper electrode 7a and the conductive film 13' inside the contact aperture 9a. Hereby, the upper electrode 7a and the conductive film 13' are physically separated from each other. In this structure, a substantial diffusion length of Al (aluminum) atoms from the conductive film 13' to the upper electrode 7a of which major components is Pt (platinum) increases, and possible reactions between Pt (platinum) and Al (aluminum) can be controlled effectively.

Manufacturing Method

Next, a method of manufacturing a ferroelectric memory cell 101 according to the second embodiment of the present invention will be explained. In the method of manufacturing the ferroelectric memory cell 101, the process of forming the MOS transistor 2 up to the process of forming the contact apertures 9a and 9b respectively for the upper electrode 7a and the lower electrode 7b of the capacitor unit 7 are the same as the processes shown in FIGS. 2a to 2e with respect to the first embodiment of the present invention. In addition, the diameter of the contact apertures 9a and 9b are, for instance, set to 0.65 μm. After the process of forming the contact apertures 9a and 9b respectively for the upper electrode 7a and the lower electrode 7b shown in FIG. 2e, the ferroelectric memory cell 101 is formed through processes shown in FIGS. 5a to 5f.

Figure 5A:
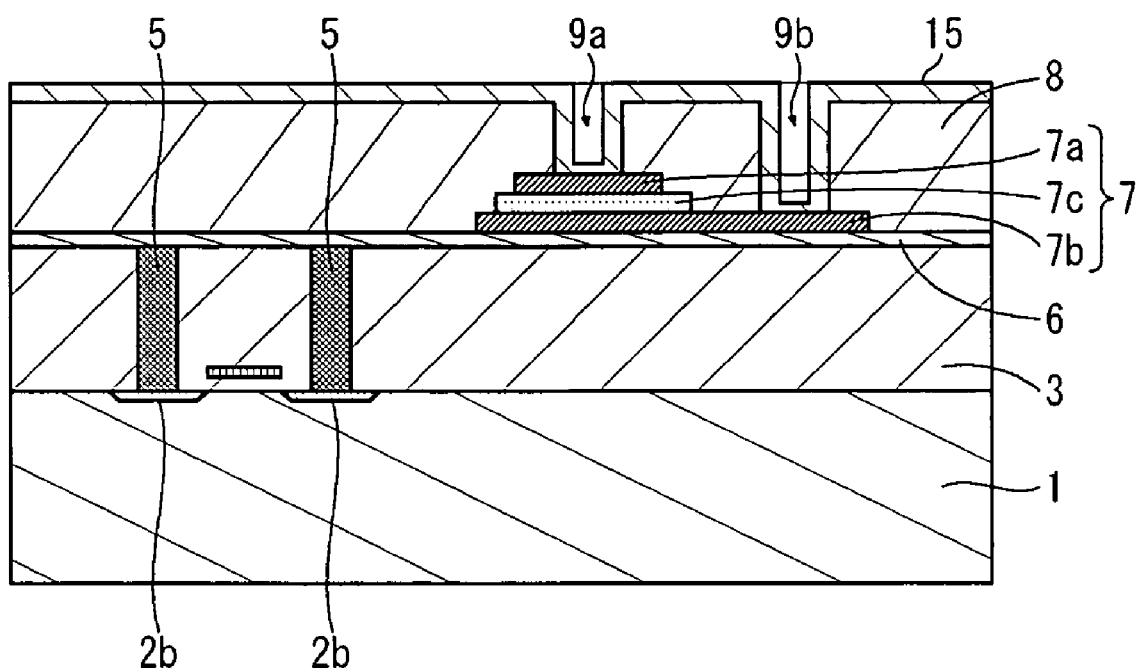
FIGS. 5a to 5f show cross-sectional views of processes for manufacturing a ferroelectric memory cell according to the second embodiment of the present invention.

As shown in FIG. 5a, an insulation film 15 covering the insulation film 8 and the inside of the contact apertures 9a and 9b is formed by the CVD method. The insulation film 15 is preferably made of silicon oxide ($Si_xO_y$). In this particular embodiment, a $SiO_2$ film of P-TEOS is used as the insulation film 15. The thickness of the insulation film 15 is preferably 150 to 225 nm. In concrete terms, the deposition thickness of the insulation film 15 is decided by the diameter of the contact aperture 9a/9b and the film thickness of the conductive film 11' on the top of the contact aperture 9a/9b. FIG. 4 shows a correlation of three elements i.e. the thickness of the insulation film 15, the diameter of the contact aperture 9a/9b and the thickness of the conductive film 11'. In FIG. 4, it is assumed that the diameter of the contact aperture 9a/9b is D, the thickness of the insulation film 15 is t1 and the thickness of the conductive film 11' on the top of the contact aperture 9a/9b is t2. Then the correlation of three elements can be represented as $D=2*(t1+t2)$. Accordingly, from this formula, a formula represented as $t1=D/2-D2$ may be easily obtained. Therefore, by forming the insulation film 15 with the thickness of t1 or more, it is expected that the top of the contact aperture 9a/9b will be completely closed by the conductive film 11' to be formed in the later process, while the air gap 22 is formed inside the contact aperture 9a/9b. In addition, as for the material of the insulation film 15, instead of using silicon oxide ($Si_xO_y$), it is also possible to use a silicon nitride ($Si_xN_y$), a silicon oxynitride ($Si_xO_yN_z$), or a silicon carbide ($Si_xC_y$) as major component. Moreover, instead of using the insulation film 15, it is also possible to use a conductive film using titanium nitride ($Ti_xN_y$) or tantalum oxide ($Ta_xO_y$) as its major component.

Figure 5B:
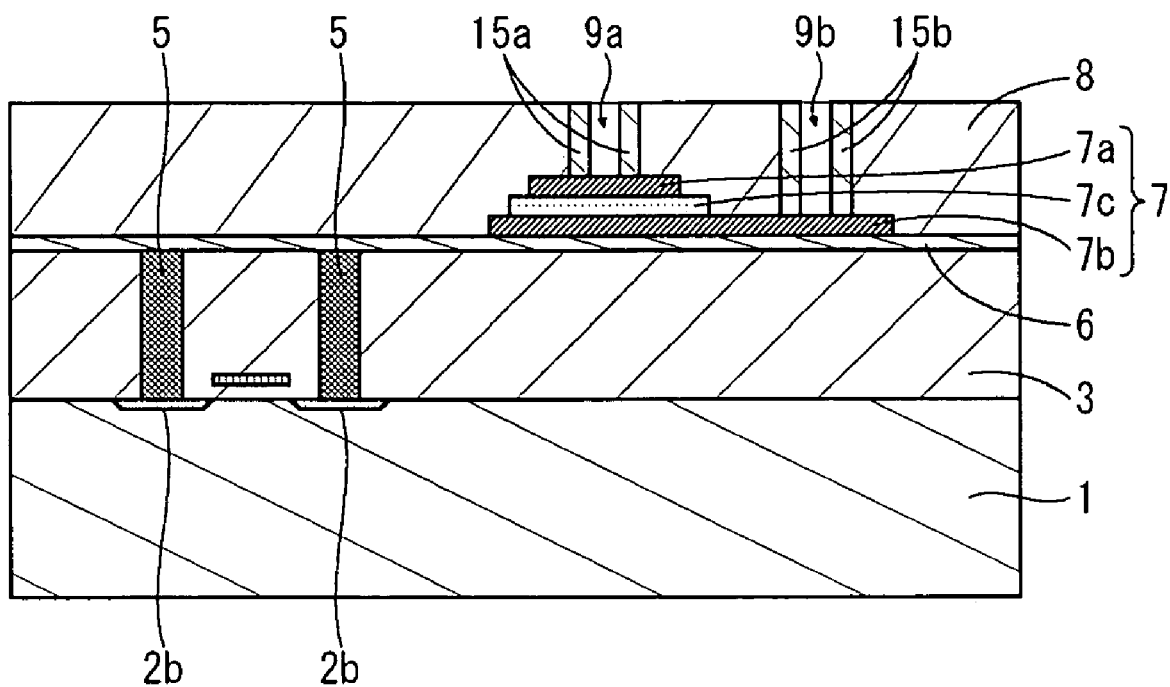

Next, as shown in FIG. 5b, the side wall film 15a and a side wall film 15b are formed on the side wall of the contact apertures 9a and 9b, respectively, by etching back the insulation film 15. As for the gas necessary for the etch-back process, for instance, $C_4F_8$ (octafluorocyclobutane), Ar (argon), $O_2$ (oxygen) and CO (carbon monoxide) can be used. The conditions of the etch-back process are, for instance, set to $C_4F8/Ar/O_2/CO=14/100/150/5$ sccm for a gas flow rate, 1.5 kW kilo watt) for RF power, and 50 mTorr (mili Torr) for pressure inside the chamber.

Figure 5C:
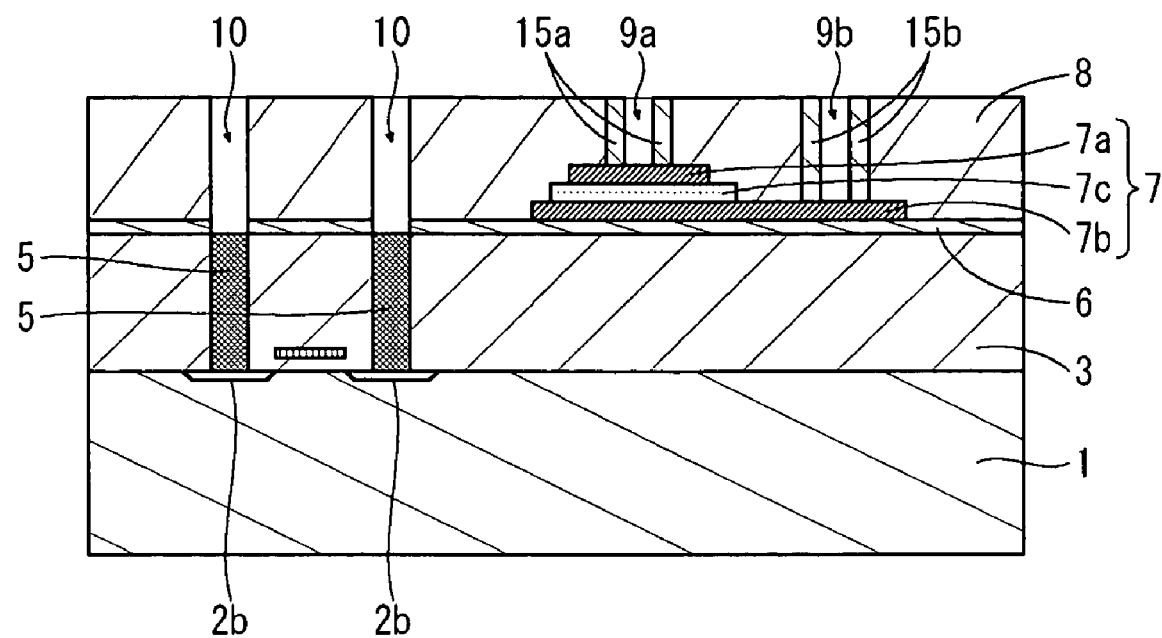

Next, as shown in FIG. 5c, contact apertures 10 which expose the upper surface of the electrical plug 5 are formed by photo-lithography and etching. As for the gas necessary for the etching process, for example, $CHF_3$ (trifluoromethane), $CF_4$ (carbon tetrafluoride), and Ar (argon) can be used. The conditions of the etching process are, for instance, set to $CHF_3/CF_4/Ar=80/15/400$ sccm for a gas flow rate, 800 W for RF power and 500 mTorr for pressure inside the chamber.

Figure 5D:
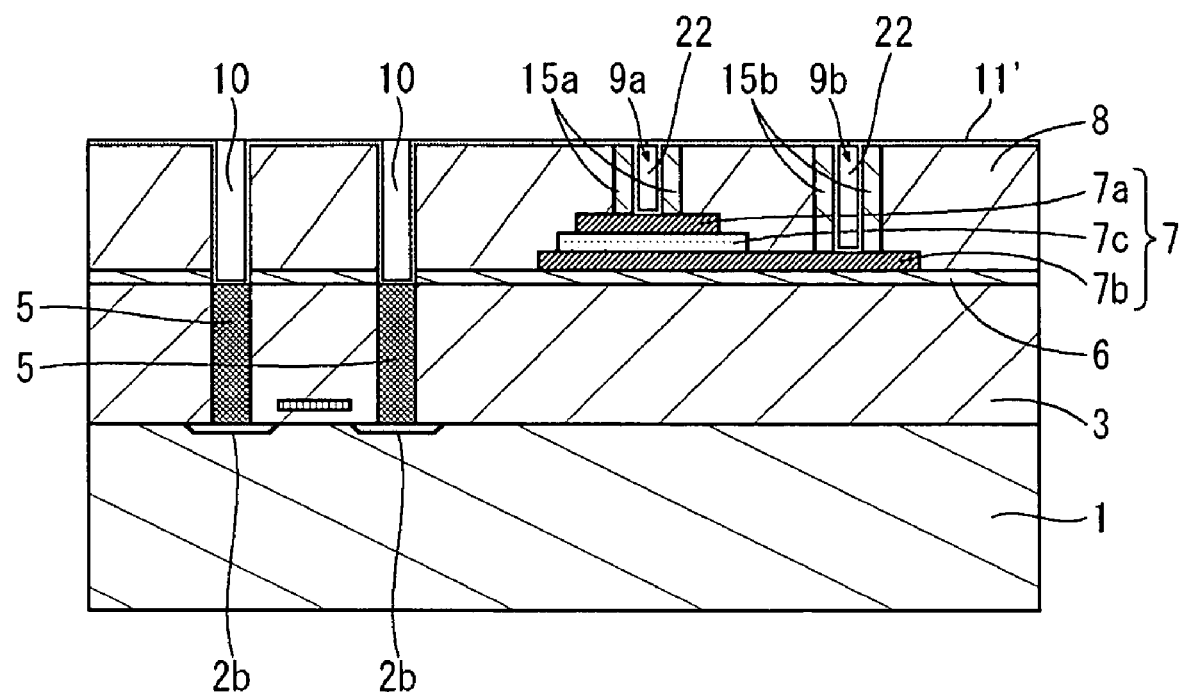

Next, as shown in FIG. 5d, a conductive film 11' is formed by sputtering in a way such that the conductive film 11' covers the upper surface of the insulation film 8 and the insides of the contact apertures 9a, 9b and 10. The conductive film 11' is a barrier film to control possible reactions between the upper electrode 7a and a conductive film 13', which is to be described later. In this case, the conductive film 11' is made of TiN (titanium nitride). The thickness of the conductive film 11' (i.e. the TiN film) is preferably 100 to 175 nm. By forming the conductive film 11' with the thickness of 100 to 175 nm, the top of the contact apertures 9a and 9b can be completely closed by the conductive film 11', as mentioned above. In addition, considering the possible varieties in the finished contact apertures 9a and 9b, the thickness of the conductive film 11' can be made thicker than mentioned above. In forming the conductive film (the TiN film) 11', for example, Ti (titanium) is used as a sputtering target and $N_2$ (nitrogen) is used as a sputtering gas. The conditions of the deposition process are, for example, set to 5 kW for DC power, 7 mTorr for pressure of sputter atmosphere and 100 degrees C. for deposition temperature.

Figure 5E:
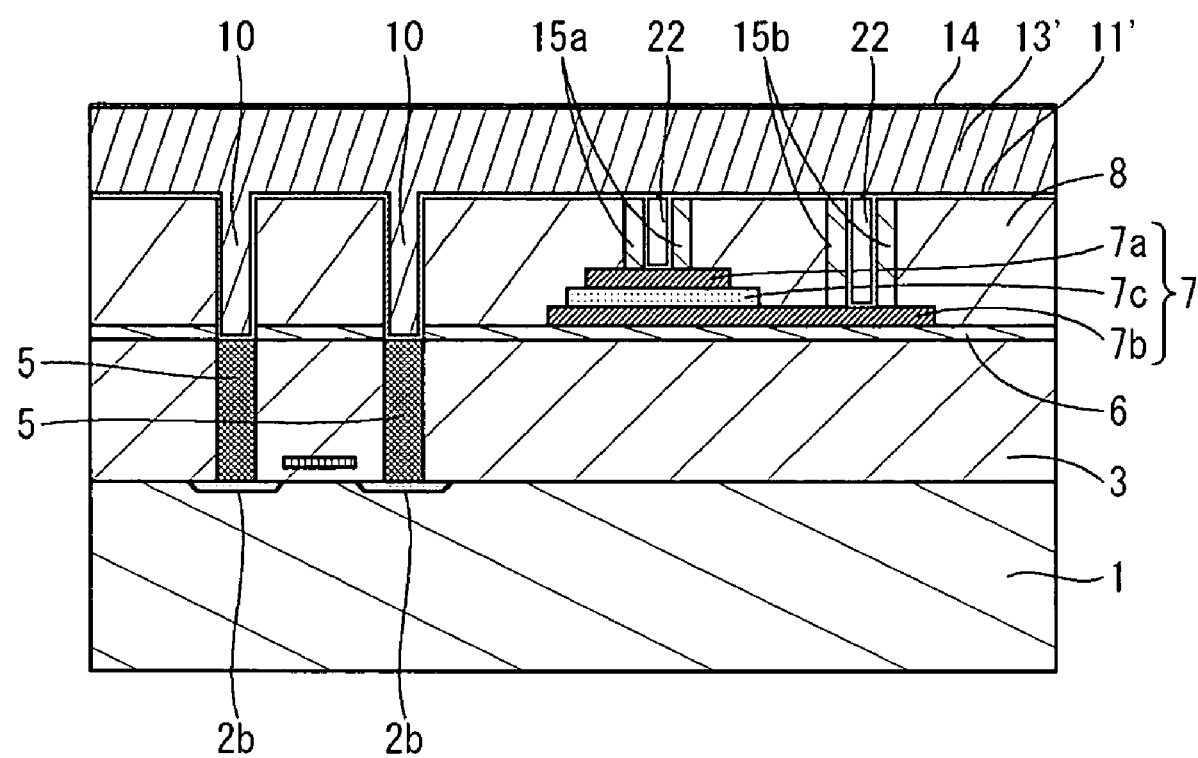

Next, as shown in FIG. 5e, conductive films 13' and 14 are sequentially formed on the conductive film 11' by sputtering.

In this particular embodiment, the conductive film 13' is a main wiring film in which Al (aluminum) alloy is used as major component. The process of forming the Al (aluminum) alloy film can be divided into two steps. In the first step of the deposition process, for example, Al (aluminum) alloy is used as a sputtering target and Ar (argon) is used as a sputtering gas. The conditions of the deposition process are, for example, set to 9 kW for DC power, 3 mTorr for pressure of sputter atmosphere, and 400 degrees C. for deposition temperature. In the second step of the deposition process, for example, Al (aluminum) alloy is used as a sputtering target and Ar (argon) is used as a sputtering gas. The conditions of the deposition process are, for example, set to 2 kW for DC power, 3 mTorr for pressure of sputter atmosphere, and 400 degrees C. for deposition temperature. Here, as for the material of the conductive film 13', instead of using the Al (aluminum) alloy, it is also possible to use Al (aluminum), Cu (copper) or an alloy of which major component is Cu (copper).

The conductive film 14 is an antireflection film to prevent reflection on the conductive film 13'. In this case, the conductive film 14 is preferably made of TiN (titanium nitride). The thickness of the conductive film 14 (the TiN film) is 75 μm. In forming the conductive film 14 (the TiN film), for example, Ti (titanium) is used as a sputtering target and $N_2$ (nitrogen) is used as a sputtering gas. The conditions of the deposition process are, for example, set to 5 kW for DC power, 7 mTorr for pressure of sputter atmosphere, and 100 degrees C. for deposition temperature.

Figure 5F:
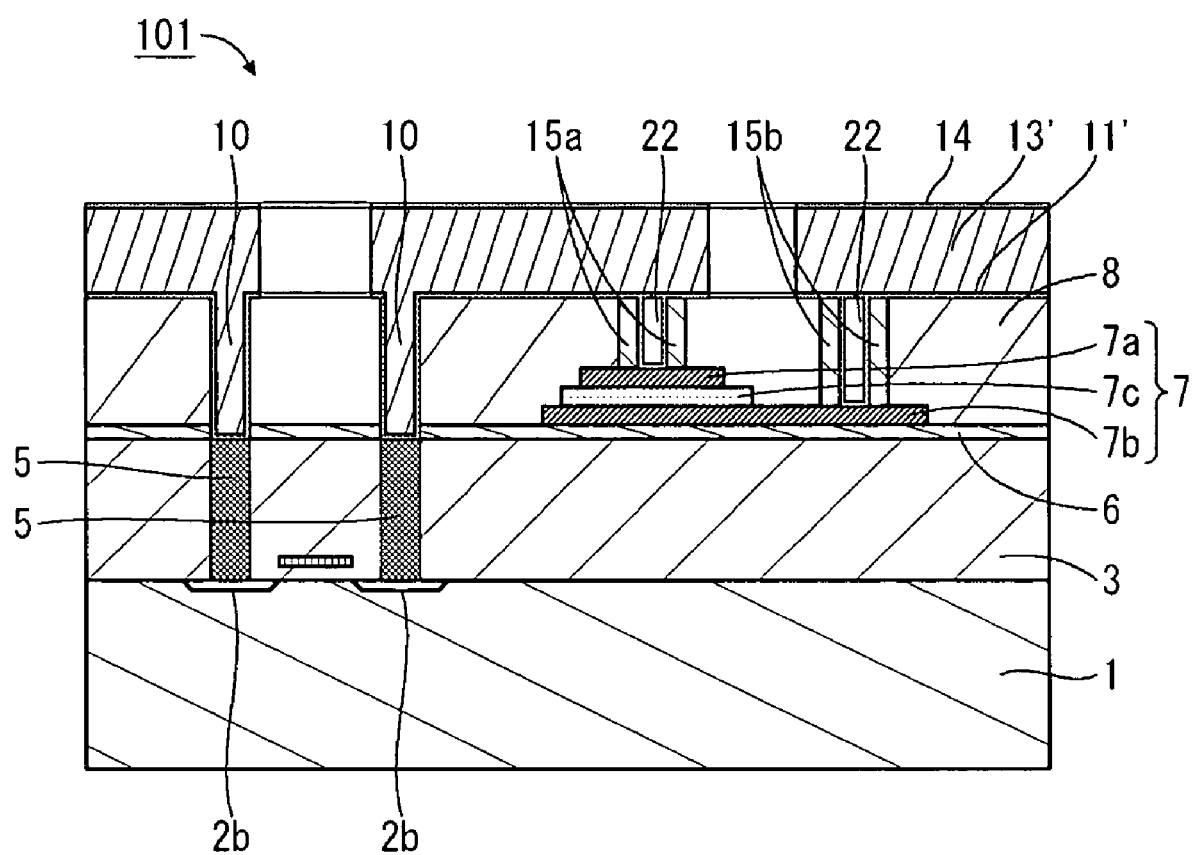

Then, as shown in FIG. 5f, the conductive films 11', 13', and 14 are patterned by photo-lithography and etching. As for the gas necessary for the etching process, for instance, $BCl_3$ (boron trichloride) and $Cl_2$ (chlorine) can be used. The conditions of the etching process are, for instance, set to $BCl_3/Cl_2=40/60$ sccm for a gas flow rate, 70 W for RF power, and 1 Pa (pascal) for pressure inside the chamber.

Processes of forming interlayer insulation films, upper layer wirings, etc. are further repeated to form completely the ferroelectric memory cell 101. However, since those processes do not directly relate to the present invention, explanation will be omitted.

Operation Effect

In the wiring structure of the semiconductor device according to the second embodiment of the present invention, the conductive film 13' made of Al (aluminum) is not formed inside the contact aperture 9a/9b. In other words, the air gap 22 which is an isolation region is placed between the upper electrode 7a/the lower electrode 7b and the conductive film 13' inside the contact aperture 9a/9b. Accordingly, the upper electrode 7a/the lower electrode 7b and the conductive film 13' are physically separated from each other. Hereby, a substantial diffusion length of Al (aluminum) atoms from the conductive film 13' to the upper electrode 7a/the lower electrode 7b of which major component is Pt (platinum) increases, and possible reactions between Pt (platinum) and Al (aluminum) can be controlled effectively.

Furthermore, since the multiple barrier structure applying the conductive film 11' is incorporated as a part of the wiring structure, surface level differences and thickening of the whole configuration of the semiconductor device should not be promoted.

Moreover, since the conductive film 11' (TiN barrier film) is formed after the annealing treatment in the oxygen environment, which is accompanied by the etching of the contact apertures 9a and 9b, reduction in the electric properties and abruption causing oxidation of the barrier film can be prevented.

Moreover, this particular embodiment does not require the patterning process of the insulation films 12a and 12b, which is needed in the first embodiment of the present invention. This provides more simplified manufacturing processes and cost saving.

(3) Third Embodiment

Wiring Structure

Figure 6:
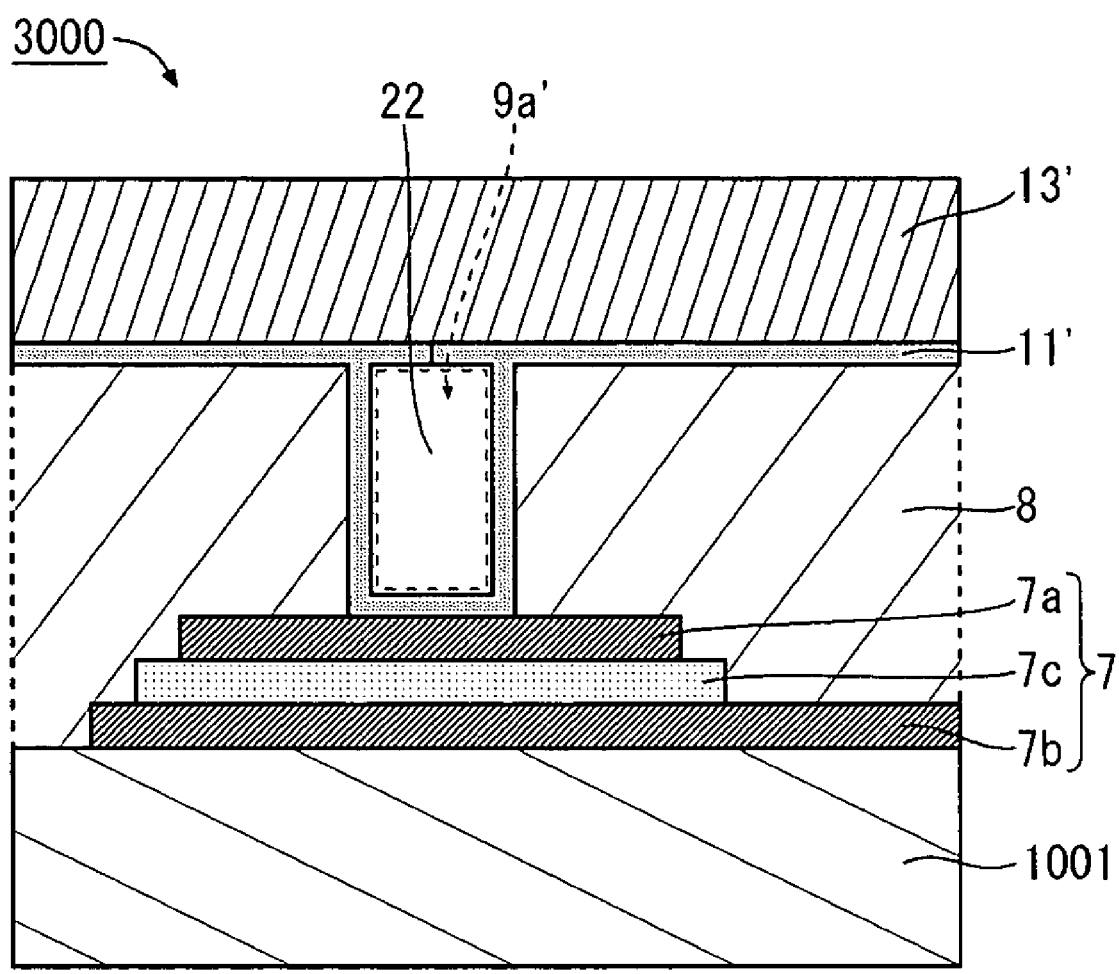
FIG. 6 shows a cross-sectional view of a ferroelectric capacitor according to a third preferred embodiment of the present invention.

FIG. 6 shows a wiring structure of a semiconductor device according to a third preferred embodiment of the present invention. In the following, a semiconductor device having a ferroelectric capacitor 3000 will be described as an example of the structure of the present invention. In FIG. 6 and the following, as for the structure elements of the ferroelectric capacitor 3000, which are the same as those of the ferroelectric capacitor 1000 shown in FIG. 1 according to the first embodiment, the same reference numbers are to be used, and redundant description on some of the same structure will be omitted.

As shown in FIG. 6, the ferroelectric capacitor 3000 has the capacitor unit 7 formed on the semiconductor substrate 1001 and the insulation film 8 covering the capacitor unit 7 as with the ferroelectric capacitor 1000. In this particular embodiment, the conductive films 11, 13 and the contact aperture 9a are replaced with conductive films 11', 13' and a contact aperture 9a', respectively, the insulation film 12a and the conductive film 16 are eliminated, and an air gap 22 is further added.

The insulation film 8 has the contact aperture 9a' to expose a part of the top face of the upper electrode 7a as with the first embodiment of the present invention. The upper electrode 7a is connected with other elements via an electric conductor i.e. the conductive film 11' formed in the contact aperture 9a'.

The conductive film 11' is a barrier film to control possible reactions between the upper electrode 7a and the conductive film 13' as with the second embodiment of the present invention. The conductive film 11' is formed on a part of the insulation film 8 and on the side wall of the contact aperture 9a'. The conductive film 11' is, for example, made of TiN (titanium nitride).

Figure 7:
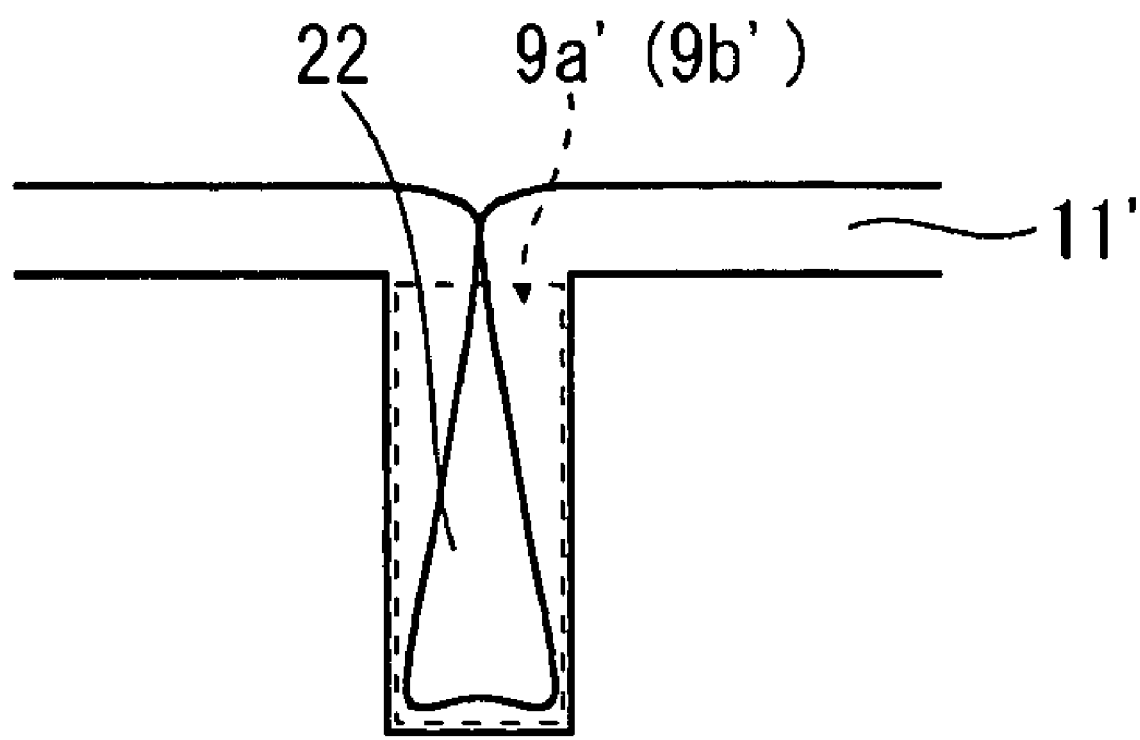
FIG. 7 shows a cross-sectional view of a contact aperture of the ferroelectric capacitor according to the third embodiment of the present invention.

In this description, as shown in FIG. 7, the semidiameter of the top of the contact apertures 9a' formed on the upper electrode 7a is smaller than a thickness of the conductive film 11'. Therefore, the top of the contact aperture 9a' formed on the upper electrode 7a is completely closed by the conductive film 11', and the air gap 22 is formed inside the contact aperture 9a' as shown in FIG. 7. This is the same with a contact aperture 9b', which will be described later. In the following, this point will be mentioned in more detail.

The conductive film 13' is a main wiring film and it is formed on the conductive film 11' except the inside of the contact aperture 9a. The major component of the conductive film 13' is, for example, Al (aluminum).

As described above, in the wiring structure according to the third embodiment of the present invention, the conductive film 13' made of Al (aluminum) is not formed inside the contact aperture 9a'. In other words, the air gap 22 which is an isolation region is placed between the upper electrode 7a and the conductive film 13' inside the contact aperture 9a'. Hereby, the upper electrode 7a and the conductive film 13' are physically separated from each other. In this structure, a substantial diffusion length of Al (aluminum) atoms from the conductive film 13' to the upper electrode 7a of which major component is Pt (platinum) increases, and possible reactions between Pt (platinum) and Al (aluminum) can be controlled effectively.

Manufacturing Method

Next, a method of manufacturing a ferroelectric memory cell 102 according to the third embodiment of the present invention will be explained. In the method of manufacturing the ferroelectric memory cell 102, the process of forming the MOS transistor 2 up to the process of forming the capacitor unit 7 are the same with the processes shown in FIG. 2a to 2d in the first embodiment of the present invention. After the process of forming the capacitor unit 7 shown in FIG. 2d, the ferroelectric memory cell 102 is formed through processes shown in FIGS. 8a to 8e.

Figure 8A:
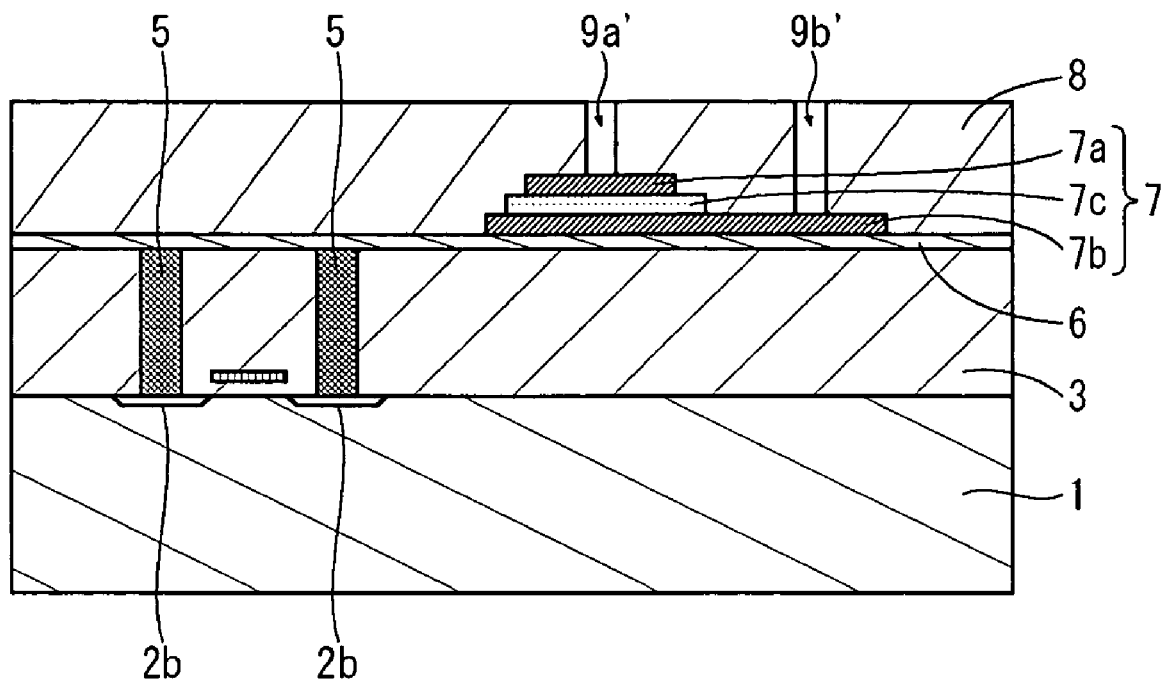
FIGS. 8a to 8e show cross-sectional views of processes for manufacturing a ferroelectric memory cell according to the third embodiment of the present invention.

As shown in FIG. 8a, a contact aperture 9a', which exposes a part of the upper electrode 7a of the capacitor unit 7, and a contact aperture 9b, which exposes a part of the lower electrode 7b, are formed by photo-lithography and etching. At this time, the contact apertures 9a and 9b are formed as having a diameter smaller than twice the thickness of the conductive film 11' on the top of the contact apertures 9a' and 9b'. By forming the contact apertures 9a and 9b with this diameter i.e. twice the thickness of the conductive film 11' on the top of the contact apertures 9a and 9b, the top of the apertures 9a and 9b can be completely closed by the conductive film 11' to be formed in the later process. As for the gas necessary for the etching process, for example, $CHF_3$ (trifluoromethane), $CF_4$ (carbon tetrafluoride), and Ar (argon) can be used. The conditions of the. etching process are, for instance, set to $CHF_3$/$CF_4$/Ar=80/15/400 sccm for a gas flow rate, 800 W for RF power, and 500 mTorr for pressure inside the chamber. After the contact apertures 9a' and 9b' are formed, a thermal treatment of one hour in oxygen environment at a temperature of 600 to 750 degrees C. is performed in order to recover the metal oxide ferroelectric characteristic.

Figure 8B:
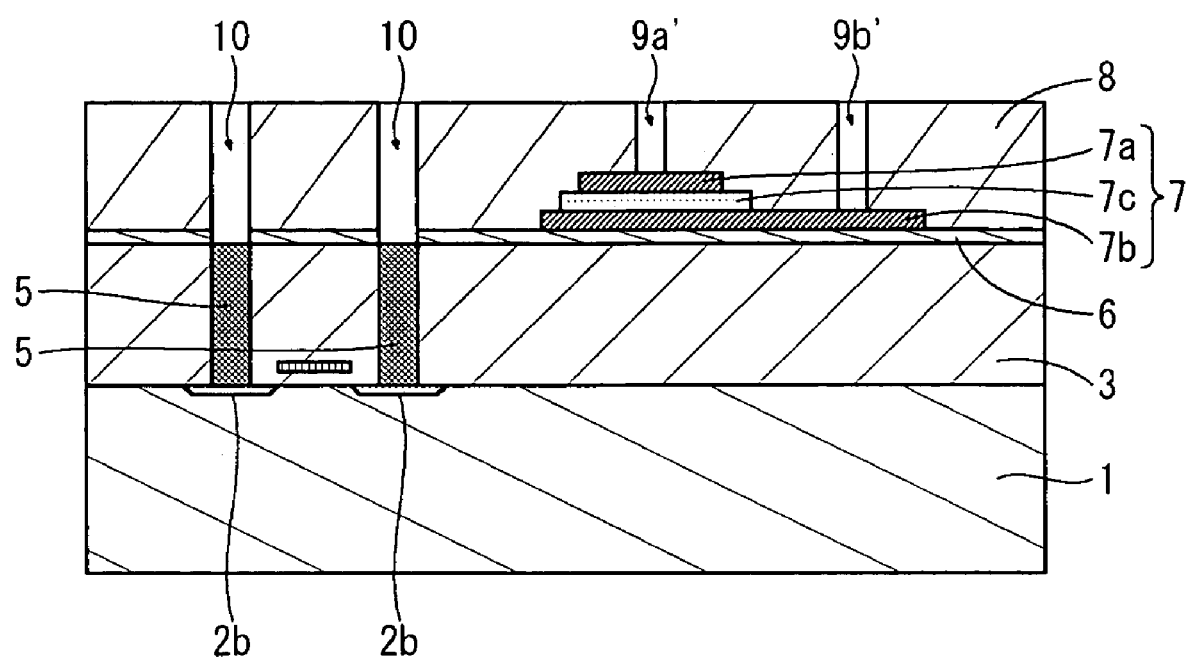

Next, as shown in FIG. 8b, contact apertures 10 which expose the upper surface of the electrical plug 5 are formed by photo-lithography and etching. As for the gas necessary for the etching process, for example, $CHF_3$ (trifluoromethane), $CF_4$ (carbon tetrafluoride), and Ar (argon) can be used. The conditions of the etching process are, for instance, set to $CHF_3$/$CF_4$/Ar=80/15/400 sccm for a gas flow rate, 800 W for RF power, and 500 mTorr for pressure inside the chamber.

Figure 8C:
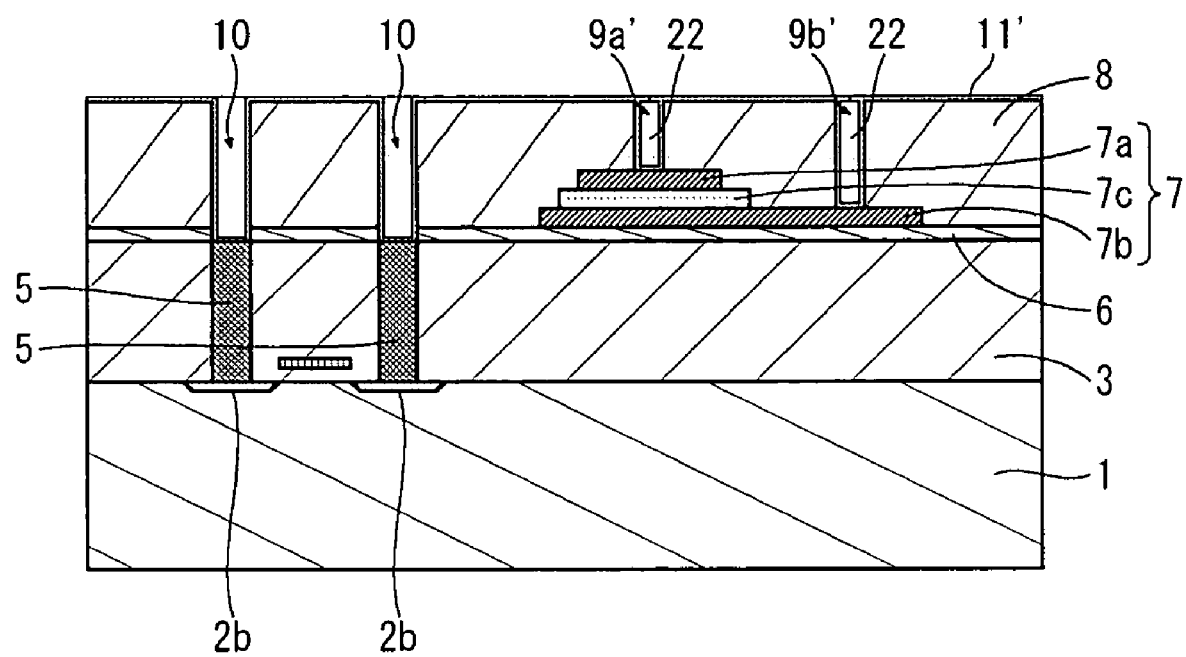

Next, as shown in FIG. 8c, a conductive film 11' is formed by sputtering in a way such that the conductive film 11' covers the upper surface of the insulation film 8 and the insides of the contact apertures 9a', 9b', and 10. The conductive film 11' is a barrier film to control possible reactions between the upper electrode 7a and a conductive film 13'. In this case, the conductive film 11' is made of TiN (titanium nitride). The thickness of the conductive film 11' (i.e. the TiN film) is 100 to 175 nm. By forming the conductive film 11' with the thickness of 100 to 175 nm, the top of the contact apertures 9a and 9b can be completely closed by the conductive film 11', as mentioned above. In forming the conductive film (the TiN film) 11', for example, Ti (titanium) is used as a sputtering target and $N_2$ (nitrogen) is used as a sputtering gas. The conditions of the deposition process are, for example, set to 5 kW for DC power, 7 mTorr for pressure of sputter atmosphere, and 100 degrees C. for deposition temperature.

Figure 8D:
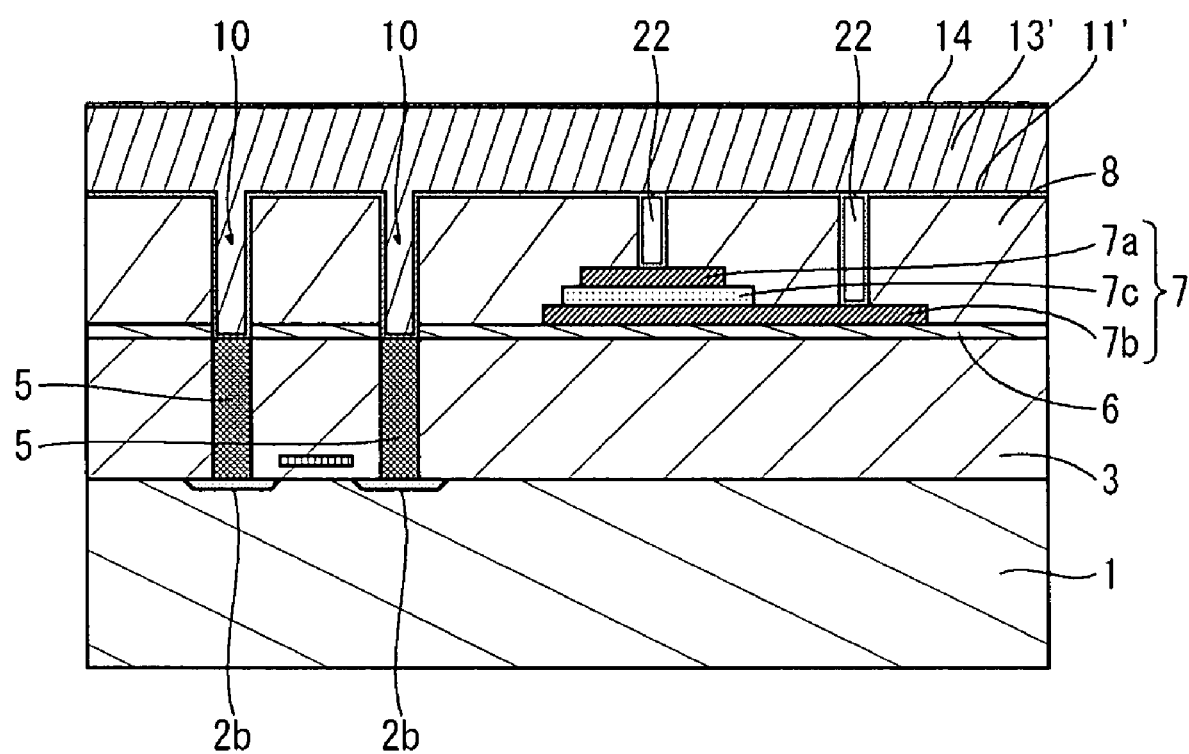

Next, as shown in FIG. 8d, conductive films 13' and 14 are sequentially formed on the conductive film 11' by sputtering.

In this particular embodiment, the conductive film 13' is a main wiring film in which Al (aluminum) alloy is used as major component. The process of forming the Al (aluminum) alloy film can be divided into two steps. In the first step of the deposition process, for example, Al (aluminum) alloy is used as a sputtering target and Ar (argon) is used as a sputtering gas. The conditions of the deposition process are, for example, set to 9 kW for DC power, 3 mTorr for pressure of sputter atmosphere, and 400 degrees C. for deposition temperature. In the second step of the deposition process, for example, Al (aluminum) alloy is used as a sputtering target and Ar (argon) is used as a sputtering gas. The conditions of the deposition process are, for example, set to 2 kW for DC power, 3 mTorr for pressure of sputter atmosphere and 400 degrees C. for deposition temperature. Here, as for the material of the conductive film 13', instead of using the Al (aluminum) alloy, it is also possible to use Al (aluminum), Cu (copper) or an alloy of which major component is Cu (copper).

The conductive film 14 is an antireflection film to prevent reflection on the conductive film 13'. In this case, the conductive film 14 is made of TiN (titanium nitride). The thickness of the conductive film 14 (the TiN film) is 75 nm. In forming the conductive film 14 (the TiN film), for example, Ti (titanium) is used as a sputtering target and $N_2$ (nitrogen) is used as a sputtering gas. The conditions of the deposition process are, for example, set to 5 kW for DC power, 7 mTorr for pressure of sputter atmosphere and 100 degrees C. for deposition temperature.

Figure 8E:
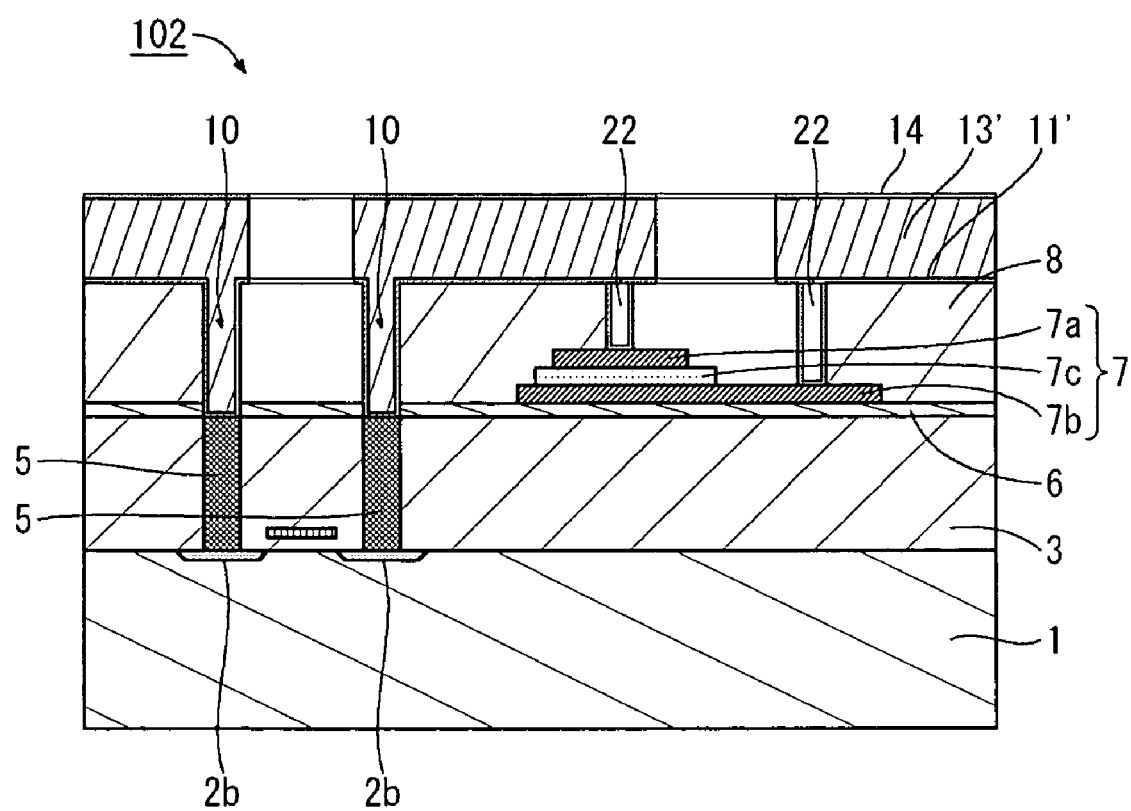

Then, as shown in FIG. 8e, the conductive films 11', 13', and 14 are patterned by photo-lithography and etching. As for the gas necessary for the etching process, for instance, $BCl_3$ (boron trichloride) and $Cl_2$ (chlorine) can be used. The conditions of the etching process are, for instance, set to $BCl_3$/$Cl_2$=40/60 sccm for a gas flow rate, 70 W for RF power, and 1 Pa (pascal) for pressure inside the chamber.

Processes of forming interlayer insulation films, upper layer wirings, etc. are further repeated to form completely the ferroelectric memory cell 102. However, since those processes do not directly relate to the present invention, explanation will be omitted.

Operation Effect

In the wiring structure of the semiconductor device according to the third embodiment of the present invention, the conductive film 13' made of Al (aluminum) is not formed inside the contact aperture 9a'/9b'. In other words, the air gap 22 which is an isolation regions is placed between the upper electrode 7a/the lower electrode 7b and the conductive film 13' inside the contact aperture 9a'/9b'. Accordingly, the upper electrode 7a/the lower electrode 7b and the conductive film 13' are physically separated from each other. Hereby, a substantial diffusion length of Al (aluminum) atoms from the conductive film 13' to the upper electrode 7a/the lower electrode 7b of which major component is Pt (platinum) increases, and possible reactions between Pt (platinum) and Al (aluminum) can be controlled effectively.

Furthermore, since the multiple barrier structure applying the conductive film 11' is incorporated as a part of the wiring structure, surface level differences and thickening of the whole configuration of the semiconductor device should not be promoted.

Moreover, since the conductive film 11' (TiN barrier film) is formed after the annealing treatment in the oxygen environment, which is accompanied by the etching of the contact apertures 9a' and 9b', reduction in the electric properties and abruption causing oxidation of the barrier film can be prevented.

Moreover, this particular embodiment does not require the processes of forming the insulation film and etching, which is needed in the second embodiment of the present invention. This provides more simplified manufacturing processes and cost saving.

This application claims priority to Japanese Patent Application No. 2004-224357. The entire disclosure of Japanese Patent Application No. 2004-224357 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least±5% of the modified term if this deviation would not negate the meaning of the word it modifies.

What is claimed is:

1. A semiconductor device, comprising:
   a semiconductor substrate;
   a first electrode over said semiconductor substrate;
   a first insulation film covering said first electrode and having an aperture to expose a part of said first electrode;
   a first conductive film on said first electrode within said aperture;
   an isolation film on said first conductive film;
   a second conductive film on said isolation film and connected to said first conductive film; and
   a wiring film on said second conductive film.

2. The semiconductor device according to claim 1, wherein said isolation film is a second insulation film.

3. The semiconductor device according to claim 2, wherein one of silicon oxide ($Si_xO_y$), silicon nitride ($Si_xN_y$), and silicon nitride oxide ($Si_xO_yN_z$) is major component of said second insulation film.

4. The semiconductor device according to claim 1, wherein one of aluminum (Al), copper (Cu), and an alloy which is made of either aluminum (Al), or copper (Cu), is major component of said wiring film.

5. The semiconductor device according to claim 1, wherein platinum (Pt) is a major component of said first electrode.

6. The semiconductor device according to claim 1, wherein titanium nitride (TiN) is a major component of said first conductive film.

7. The semiconductor device according to claim 1, further comprising,
- a second electrode formed over the semiconductor substrate, and
- a capacity insulation film which is made of a metal oxide dielectric material formed on said second electrode,
- wherein said first electrode is formed on said capacity insulation film.

8. The semiconductor device according to claim 7, further comprising,
- a MOS transistor formed over said semiconductor substrate, said MOS transistor has a diffusion layer electrically connected to said first electrode via said first and second conductive films and said wiring film.

9. A semiconductor device comprising:
- a semiconductor substrate;
- a first electrode over said semiconductor substrate;
- a first insulation film covering said first electrode and having an aperture to expose a part of said first electrode;
- a first conductive film on a part of said first insulation film and first electrode inside said aperture;
- an isolation region inside said aperture; and
- a second conductive film on said first conductive film and said isolation region,
- wherein said isolation region is an air gap.

10. The semiconductor device according to claim 9, further comprising a side wall film formed on an inner wall of said aperture, wherein said first conductive film is formed on said side wall film.

11. The semiconductor device according to claim 10, wherein a top of said aperture is closed by said first conductive film.

12. The semiconductor device according to claim 10, wherein said side wall film is an insulator, and a major component of said side wall film is one of silicon oxide ($Si_xO_y$), silicon nitride ($Si_xN_y$) and silicon nitride oxide ($Si_xO_yN_z$).

13. The semiconductor device according to claim 10, wherein said side wall film is an electrical conductor, and a major component of said side wall film is either titanium nitride ($Ti_xN_y$) or tantalum nitride ($Ta_xN_y$).

14. The semiconductor device according to claim 9, wherein a diameter of said aperture is smaller than twice a thickness of said first conductive film on the top of said aperture, and the top of said aperture is closed by said first conductive film.

15. A semiconductor device comprising:
- a semiconductor substrate;
- a first electrode over the semiconductor substrate;
- an insulation film covering the first electrode and the semiconductor substrate, the insulation film having an aperture that exposes the first electrode;
- a first conductive film on an upper surface of the insulation film, sidewalls of the aperture and the first electrode exposed at a bottom of the aperture;
- an isolation film on the first conductive film within the aperture;
- a second conductive film directly on the first conductive film over the upper surface of the insulation film, and directly on the isolation film within the aperture; and
- a wiring film on the second conductive film over the upper surface of the insulation film, and on the second conductive film within the aperture.

16. The semiconductor device of claim 15, wherein the isolation film is silicon oxide, silicon nitride or silicon nitride oxide.

17. The semiconductor device of claim 15, wherein the wiring film is aluminum, copper, or an alloy of aluminum and copper.

* * * * *